(12) United States Patent
Liu et al.

(10) Patent No.: US 11,621,229 B2
(45) Date of Patent: Apr. 4, 2023

(54) WIRING STRUCTURE AND METHOD FOR MANUFACTURING THE SAME

(71) Applicant: Advanced Semiconductor Engineering, Inc., Kaohsiung (TW)

(72) Inventors: Syu-Tang Liu, Kaohsiung (TW); Huang-Hsien Chang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 118 days.

(21) Appl. No.: 17/071,989

(22) Filed: Oct. 15, 2020

(65) Prior Publication Data

US 2022/0122919 A1 Apr. 21, 2022

(51) Int. Cl.
*H01L 23/538* (2006.01)
*H01L 23/00* (2006.01)
*H01L 21/48* (2006.01)

(52) U.S. Cl.
CPC ...... *H01L 23/5386* (2013.01); *H01L 21/4857* (2013.01); *H01L 23/5383* (2013.01); *H01L 23/5385* (2013.01); *H01L 24/16* (2013.01); *H01L 2224/16227* (2013.01)

(58) Field of Classification Search
CPC ............ H01L 23/5386; H01L 21/4857; H01L 23/5383; H01L 23/5385; H01L 24/16; H01L 2224/16227; H01L 23/49822; H01L 23/49833
See application file for complete search history.

(56) References Cited

U.S. PATENT DOCUMENTS

2016/0211206 A1* 7/2016 Lee ................. H01L 23/49811
2019/0385989 A1* 12/2019 Yu .................... H01L 23/5386
2020/0411445 A1* 12/2020 Chen .................... H01L 24/19

\* cited by examiner

*Primary Examiner* — Kyoung Lee
*Assistant Examiner* — Christina A Sylvia
(74) *Attorney, Agent, or Firm* — Foley & Lardner LLP

(57) ABSTRACT

A wiring structure and a method for manufacturing the same are provided. The wiring structure includes a substrate structure, a redistribution structure, an adhesive layer and at least one conductive pillar. The redistribution structure includes at least one dielectric layer. The at least one dielectric layer defines at least one through hole extending through the dielectric layer. The adhesive layer is disposed between the redistribution structure and the substrate structure and bonds the redistribution structure and the substrate structure together. The at least one conductive pillar extends through the redistribution structure and the adhesive layer and is electrically connected to the substrate structure. A portion of the at least one conductive pillar is disposed in the through hole of the at least one dielectric layer.

19 Claims, 30 Drawing Sheets

WIRING STRUCTURE AND METHOD FOR MANUFACTURING THE SAME

BACKGROUND

1. Field of the Disclosure

The present disclosure relates to a wiring structure and a manufacturing method, and to a wiring structure including at least one conductive pillar, and a method for manufacturing the same.

2. Description of the Related Art

In the fan-out substrate (FOSub) fabrication, through vias may be used to perform vertical electrical connections. Laser drilling and plasma etching are often used to form the through vias. However, limited by a spot size of the laser drilling, the through via is difficult to reach a fine size by the laser drilling. Plasma etching may form the through via in the fine size, but its side etching issue may cause the profile of the through via to miss control, thereby decreasing a yield of the fan-out substrate.

SUMMARY

In some embodiments, a wiring structure includes a substrate structure, a redistribution structure, an adhesive layer and at least one conductive pillar. The redistribution structure includes at least one dielectric layer. The at least one dielectric layer defines at least one through hole extending through the dielectric layer. The adhesive layer is disposed between the redistribution structure and the substrate structure and bonds the redistribution structure and the substrate structure together. The at least one conductive pillar extends through the redistribution structure and the adhesive layer and is electrically connected to the substrate structure. A portion of the at least one conductive pillar is disposed in the through hole of the at least one dielectric layer.

In some embodiments, a method for manufacturing a wiring structure includes: (a) forming a redistribution structure on a carrier, wherein the redistribution structure includes a first dielectric layer, a second dielectric layer and at least one circuit layer between the first dielectric layer and the second dielectric layer, wherein the first dielectric layer defines a plurality of first openings extending through the first dielectric layer, and the second dielectric layer is formed to fill the first openings of the first dielectric layer; (b) forming a plurality of through holes extending through the filled portions of the second dielectric layer in the first openings of the first dielectric layer; (c) forming a plurality of first pillar portions in the through holes of the second dielectric layer; (d) forming an adhesive layer to cover the second dielectric layer and the first pillar portions; (e) forming a plurality of through holes extending through the adhesive layer to expose portions of the first pillar portions; and (f) forming a plurality of second pillar portions in the through holes of the adhesive layer and on the exposed portions of the first pillar portions to form a plurality of conductive pillars.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
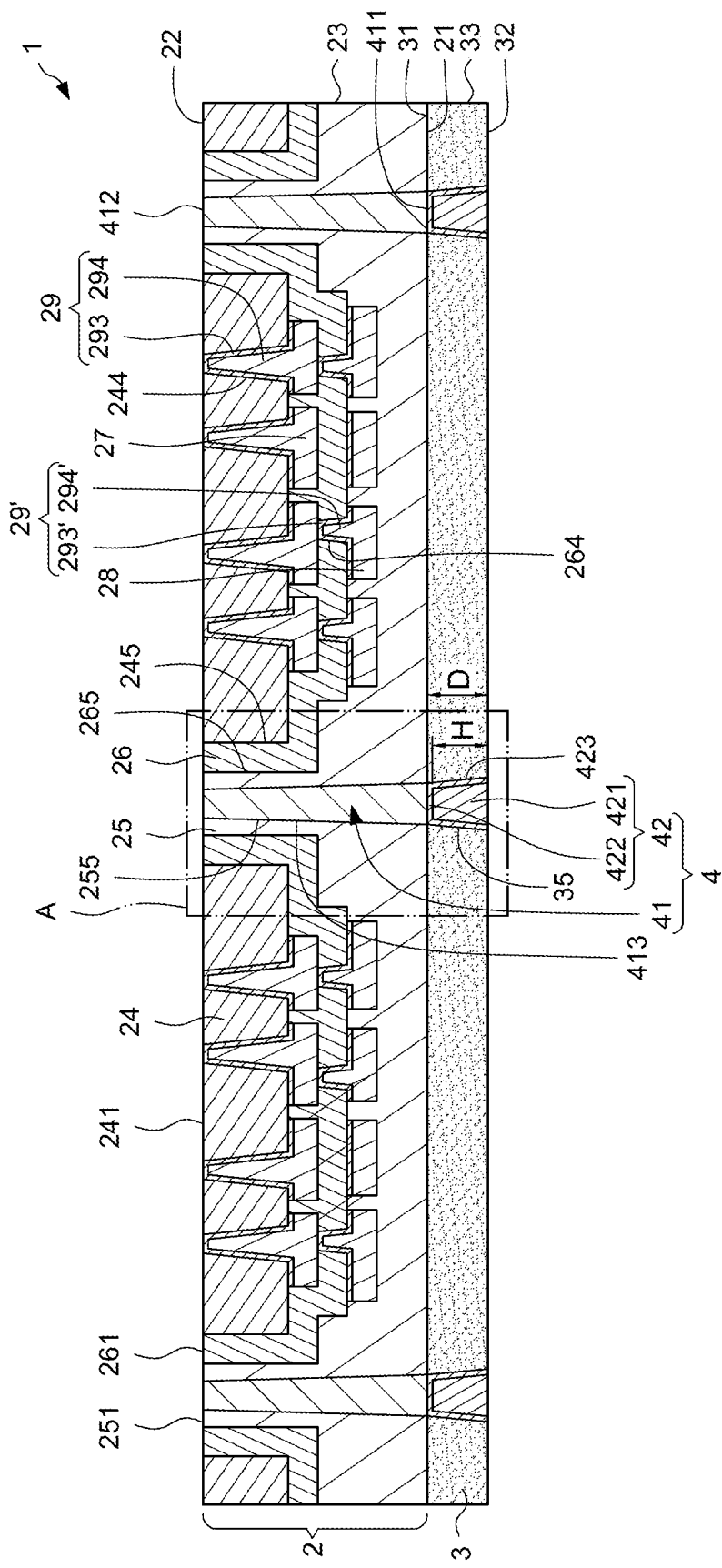
FIG. 1 illustrates a cross-sectional view of a wiring structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

At least some embodiments of the present disclosure provide for a wiring structure which has fine size conductive pillars. In some embodiments, the wiring structure includes at least one conductive pillar extending through a redistribution structure and an adhesive layer. At least some embodiments of the present disclosure further provide for techniques for manufacturing the wiring structure to adjust at least one through hole to a fine size and a desired profile.

Figure 2:
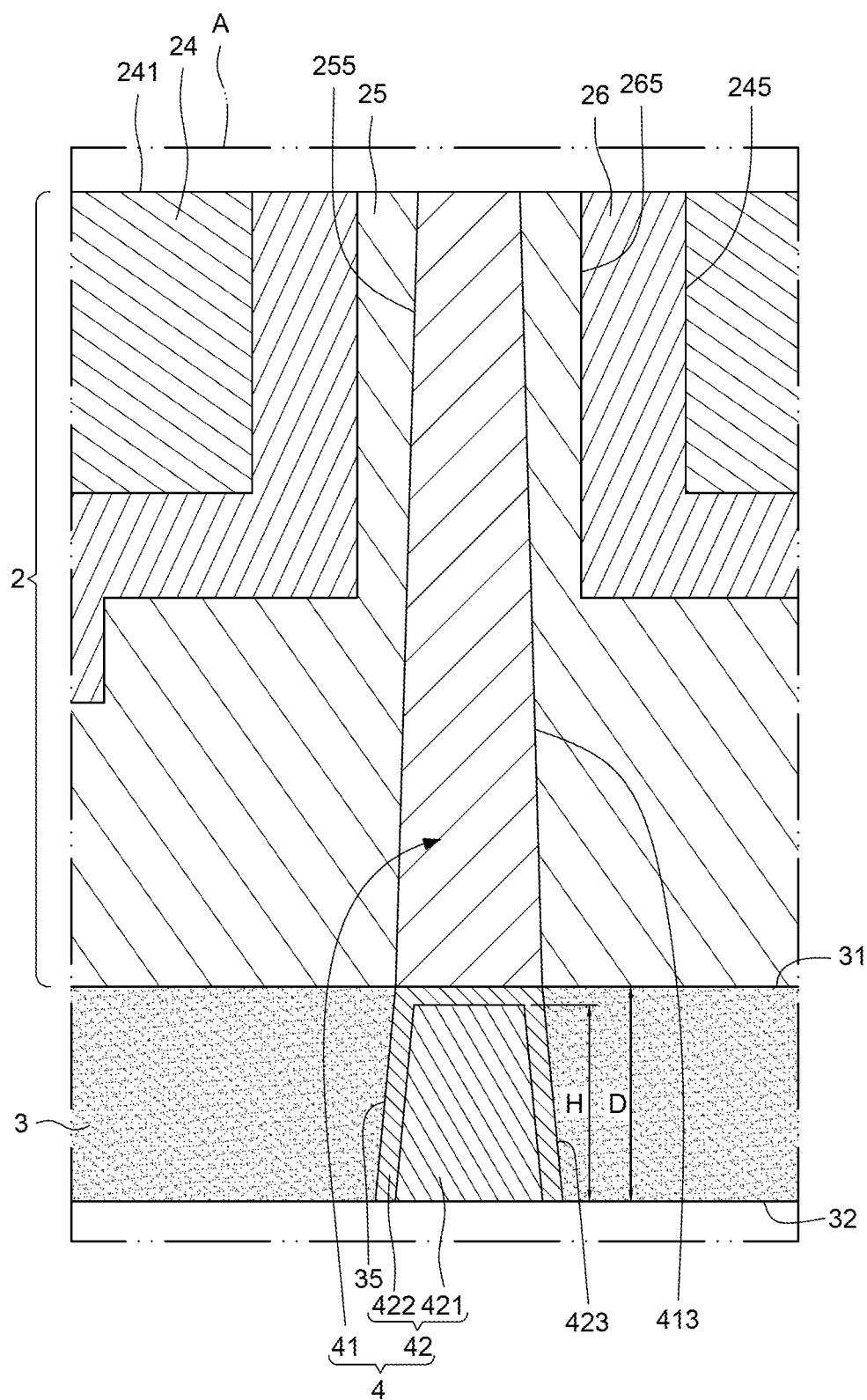
FIG. 2 illustrates an enlarged view of a region "A" in FIG. 1.

FIG. 1 illustrates a cross-sectional view of a wiring structure 1 according to some embodiments of the present disclosure. FIG. 2 illustrates an enlarged view of a region "A" in FIG. 1. The wiring structure 1 may include a redistribution structure (e.g., a conductive structure) 2, an adhesive layer 3 and at least one conductive pillar 4.

The redistribution structure 2 includes at least one dielectric layer (including, for example, a first dielectric layer 24, at least one second dielectric layer 25 and an intermediate dielectric layer 26), at least one circuit layer (including, for example, a first circuit layer 27 and a second circuit layer 28) in contact with the at least one dielectric layer, and a plurality of inner conductive vias (including, for example, inner conductive vias 29 and inner conductive vias 29'). In some embodiments, the redistribution structure 2 may be similar to a coreless substrate, and may be a bumping level redistribution structure. The redistribution structure 2 may be also referred to as "a high-density conductive structure" or "a high-density stacked structure". The circuit layer (including, for example, the first circuit layer 27 and the second circuit layer 28) of the redistribution structure 2 may be also referred to as "a high-density circuit layer". In some embodiments, a density of a circuit line (including, for example, a trace or a pad) of the high-density circuit layer is greater than a density of a circuit line of a low-density circuit layer. That is, the count of the circuit line (including, for example, the trace or the pad) in a unit area of the high-density circuit layer is greater than the count of the circuit line in an equal unit area of the low-density circuit layer, such as about 1.2 times or greater, about 1.5 times or greater, or about 2 times or greater, or about 3 times or greater. Alternatively, or in combination, a line width/line space (L/S) of the high-density circuit layer is less than an L/S of the low-density circuit layer, such as about 90% or less, about 50% or less, or about 20% or less. Further, the conductive structure that includes the high-density circuit layer may be designated as the "high-density conductive structure", and the conductive structure that includes the low-density circuit layer may be designated as a "low-density conductive structure".

The redistribution structure 2 has a first surface (e.g., a bottom surface) 21, a second surface (e.g., a top surface) 22 opposite to the first surface 21, and a peripheral surface 23 extending between the first surface 21 and the second surface 22. In some embodiments, the at least one dielectric layer may include a plurality of dielectric layers (including, for example, the first dielectric layer 24, the second dielectric layer 25 and the intermediate dielectric layer 26). The at least one circuit layer (including, for example, a first circuit layer 27 and a second circuit layer 28) may be between the dielectric layers. As shown in FIG. 1, the dielectric layers (including, for example, the first dielectric layer 24, the second dielectric layer 25 and the intermediate dielectric layer 26) are stacked on one another. For example, the first dielectric layer 24 may be the topmost dielectric layer, the second dielectric layer 25 may be the bottommost dielectric layer and disposed adjacent to the first dielectric layer 24, and the intermediate dielectric layer 26 may be disposed between the first dielectric layer 24 and the second dielectric layer 25. In some embodiments, a material of the dielectric layers (including, for example, the first dielectric layer 24, the second dielectric layer 25 and the intermediate dielectric layer 26) is transparent, and can be seen through or detected by human eyes or machine. In some embodiments, a transparent material of the dielectric layers (including, for example, the first dielectric layer 24, the second dielectric layer 25 and the intermediate dielectric layer 26) has a light transmission for a wavelength in the visible range (or other pertinent wavelength for detection of a mark) of at least about 60%, at least about 70%, or at least about 80%. In some embodiments, a material of the dielectric layers (including, for example, the first dielectric layer 24, the second dielectric layer 25 and the intermediate dielectric layer 26) may be made of a cured photoimageable dielectric (PID) material such as epoxy or polyimide (PI) including photoinitiators.

In some embodiments, as shown in FIG. 1, the first dielectric layer 24 may define at least one first via hole 244 and at least one first opening 245 extending through the first dielectric layer 24. The intermediate dielectric layer 26 covers the first dielectric layer 24 and defines at least one second via hole 264 extending through the intermediate dielectric layer 26. That is, a portion of the intermediate dielectric layer 26 may extend into the first opening 245 of the first dielectric layer 24. Further, the extending portion of the intermediate dielectric layer 26 may define a second opening 265, and a portion of the second dielectric layer 25 may fill the second opening 265 of the intermediate dielectric layer 26. That is, the filled portion of the second dielectric layer 25 disposed in the second opening 265 of the intermediate dielectric layer 26 also fills the first opening 245 of the first dielectric layer 24, and the extending portion of the intermediate dielectric layer 26 is interposed between the first dielectric layer 24 and the filled portion of the second dielectric layer 25. In some embodiments, a top surface 251 of the second dielectric layer 25 may be substantially coplanar with a top surface 241 of the first dielectric layer 24. In addition, a top surface 261 of the intermediate dielectric layer 26 may be substantially coplanar with the top surface 241 of the first dielectric layer 24 and the top surface 251 of the second dielectric layer 25.

In some embodiments, the filled portion of the second dielectric layer 25 may define a through hole 255 extending through the filled portion of the second dielectric layer 25. As shown in FIG. 1, a size (e.g., a width) of the through hole 255 of the second dielectric layer 25 may be less than a size (e.g., a width) of the second opening 265 of the intermediate dielectric layer 26, and the size of the second opening 265 of the intermediate dielectric layer 26 may be less than a size (e.g., a width) of the first opening 245 of the first dielectric layer 24. That is, the size of the first opening 245 of the first dielectric layer 24 may be reduced to the size of the through hole 255 of the second dielectric layer 25 through the extending portion of the intermediate dielectric layer 26 and the filled portion of the second dielectric layer 25.

The circuit layer (including, for example, the first circuit layer 27 and the second circuit layer 28) may be fan-out circuit layer or redistribution layers (RDLs), and an L/S of the circuit layer (including, for example, the first circuit layer 27 and the second circuit layer 28) may be less than about 10 µm/10 µm, less than or equal to 8 µm/8 µm, less than or equal to 5 µm/5 µm, less than or equal to 3 µm/3 µm, less than or equal to about 2 µm/about 2 µm, or less than or equal to about 1.8 µm/about 1.8 µm. In some embodiments, the first circuit layer 27 is embedded between the first dielectric layer 24 (i.e., the topmost dielectric layer) and the intermediate dielectric layer 26, and the second circuit layer 28 is embedded between the intermediate dielectric layer 26 and the second dielectric layer 25 (i.e., the bottommost dielectric layer). As shown in FIG. 1, the first circuit layer 27 is covered by the intermediate dielectric layer 26, and the second circuit layer 28 is covered by the second dielectric layer 25.

Some of the inner conductive vias (e.g., the inner conductive vias 29') are disposed in the second via hole(s) 264 of the intermediate dielectric layer 26 and between the first circuit layer 27 and the second circuit layer 28 for electrically connecting the first circuit layer 27 and the second circuit layer 28. Some of the inner conductive vias (e.g., the inner conductive vias 29) are disposed in the first via hole(s) 244 of the first dielectric layer 24 and exposed from the second surface (i.e., the top surface) 22 of the redistribution structure 2 (e.g., the top surface of the first dielectric layer 24). In some embodiments, each inner conductive via 29 may include a seed layer 293 and a conductive material 294 (e.g., a plating metallic material) disposed on the seed layer 293. Similarly, each inner conductive via 29' may include a seed layer 293' and a conductive material 294' (e.g., a plating metallic material) disposed on the seed layer 293'. Each inner conductive via (including, for example, the inner conductive vias 29, 29') tapers upwardly along a direction from the first surface (i.e., the bottom surface) 21 towards the second surface (i.e., the top surface) 22 of the redistribution structure 2.

The adhesive layer 3 is disposed on the first surface 21 of the redistribution structure 2 (i.e., the bottom surface of the second dielectric layer 25). The adhesive layer 3 has a top surface 31, a bottom surface 32 opposite to the top surface 31, and a peripheral surface 33 extending between the top surface 31 and the bottom surface 32. In some embodiments, the peripheral surface 33 of the adhesive layer 3 may be substantially coplanar with the peripheral surface 23 of the redistribution structure 2. In addition, a bonding force between two adjacent dielectric layers 24, 25, 26 of the redistribution structure 2 may be greater than a bonding force between the second dielectric layer 25 of the redistribution structure 2 and the adhesive layer 3. Further, a surface roughness of a boundary between two adjacent dielectric layers 24, 25, 26 of the redistribution structure 2 may be greater than a surface roughness of a boundary between the second dielectric layer 25 of the redistribution structure 2 and the adhesive layer 3, such as about 1.1 times or greater, about 1.3 times or greater, or about 1.5 times or greater in terms of root mean squared surface roughness.

In some embodiments, a material of the adhesive layer 3 is transparent, and can be seen through by human eyes or machine. In addition, the material of the adhesive layer 3 may be different from the material of the dielectric layers (including, for example, the first dielectric layer 24, the second dielectric layer 25 and the intermediate dielectric layer 26) of the redistribution structure 2. In some embodiments, the adhesive layer 3 may define at least one through hole 35 extending through the adhesive layer 3 and corresponding to the through hole 255 of the second dielectric layer 25.

The at least one conductive pillar 4 extends through the redistribution structure 2 (e.g., the second dielectric layer 25) and the adhesive layer 3. In some embodiments, the at least one conductive pillar 4 may extend through the filled portion of the second dielectric layer 25 (i.e., the bottommost dielectric layer) in the second opening 265 of the intermediate dielectric layer 26 and the first opening 245 of the first dielectric layer 24, and a width of the at least one conductive pillar 4 may be less than about 50 µm.

In some embodiments, as shown in FIG. 1, the at least one conductive pillar 4 may includes a first pillar portion 41 extending through the redistribution structure 2 (e.g., the filled portion of the second dielectric layer 25 in the second opening 265 of the intermediate dielectric layer 26) and a second pillar portion 42 extending through the adhesive layer 3. That is, the at least one conductive pillar 4 may be a two-piece structure. In some embodiments, a height of the second pillar portion 42 may be less than a height of the first pillar portion 41.

The first pillar portion 41 may be disposed in the through hole 255 of the filled portion of the second dielectric layer 25. In some embodiments, the first pillar portion 41 may be directly in contact with the second dielectric layer 25. That is, there is no seed layer between the first pillar portion 41 and the second dielectric layer 25. In addition, a height of the first pillar portion 41 may be substantially equal to a thickness of the redistribution structure 2.

The first pillar portion 41 has a first end surface 411 contacting the second pillar portion 42 and a second end surface 412 opposite to the first end surface 411. In some embodiments, the first end surface 411 of the first pillar portion 41 may be non-coplanar with the first surface 21 (i.e., the bottom surface) of the redistribution structure 2, and the second end surface 412 of the first pillar portion 41 may be substantially coplanar with the second surface 22 (i.e., the top surface) of the redistribution structure 2. In some embodiments, the first end surface 411 of the first pillar portion 41 may be recessed from the first surface 21 (i.e., the bottom surface) of the redistribution structure 2. In some embodiments, the first pillar portion 41 may taper upward form the first end surface 411 toward the second end surface 412 of the first pillar portion 41. That is, the first pillar portion 41 is trapezoidal in shape.

The second pillar portion 42 may be disposed in the through hole 35 of the adhesive layer 3 and in contact with the first pillar portion 41. In some embodiments, the second pillar portion 42 may include a conductive material 421 embedded in the adhesive layer 3 (e.g., disposed in the through hole 35) and a seed layer 422 disposed between the conductive material 421 and the first pillar portion 41. That is, the second pillar portion 42 may be in contact with the first pillar portion 41 through the seed layer 422. In addition, a height H of the conductive material 421 may be less than a depth D of the through hole 35 of the adhesive layer 3. In addition, a height of the second pillar portion 42 may be substantially equal to a thickness of the adhesive layer 3. In some embodiments, the second pillar portion 42 may taper upward form the bottom surface 32 of the adhesive layer 3 toward the top surface 31 of the adhesive layer 3. That is, the second pillar portion 42 is trapezoidal in shape.

In some embodiments, as shown in FIG. 1, the seed layer 422 of the second pillar portion 42 may further extend between the conductive material 421 and the adhesive layer 3. That is, the second pillar portion 42 may be in contact with the adhesive layer 3 through the seed layer 422. In some embodiments, as shown in FIG. 2, a peripheral surface 423 of the second pillar portion 42 may be non-coplanar with a peripheral surface 413 of the first pillar portion 41. In some embodiments, the peripheral surface 423 of the second pillar portion 42 and the peripheral surface 413 of the first pillar portion 41 may be a discontinuous surface. That is, the peripheral surface 423 of the second pillar portion 42 and the peripheral surface 413 of the first pillar portion 41 are discontinuous.

In the embodiment illustrated in FIG. 1 to FIG. 2, the size of the first opening 245 of the first dielectric layer 24 may be reduced to a fine size (e.g., the size of the through hole 255 of the second dielectric layer 25) through the extending portion of the intermediate dielectric layer 26 and the filled portion of the second dielectric layer 25. That is, a fine size opening may be formed without the use of the laser drilling. In addition, the side etching issue may be eliminated to obtain a well control on the profile of the at least one conductive pillar 4. Therefore, the yield of the wiring structure 1 is improved.

Figure 3:
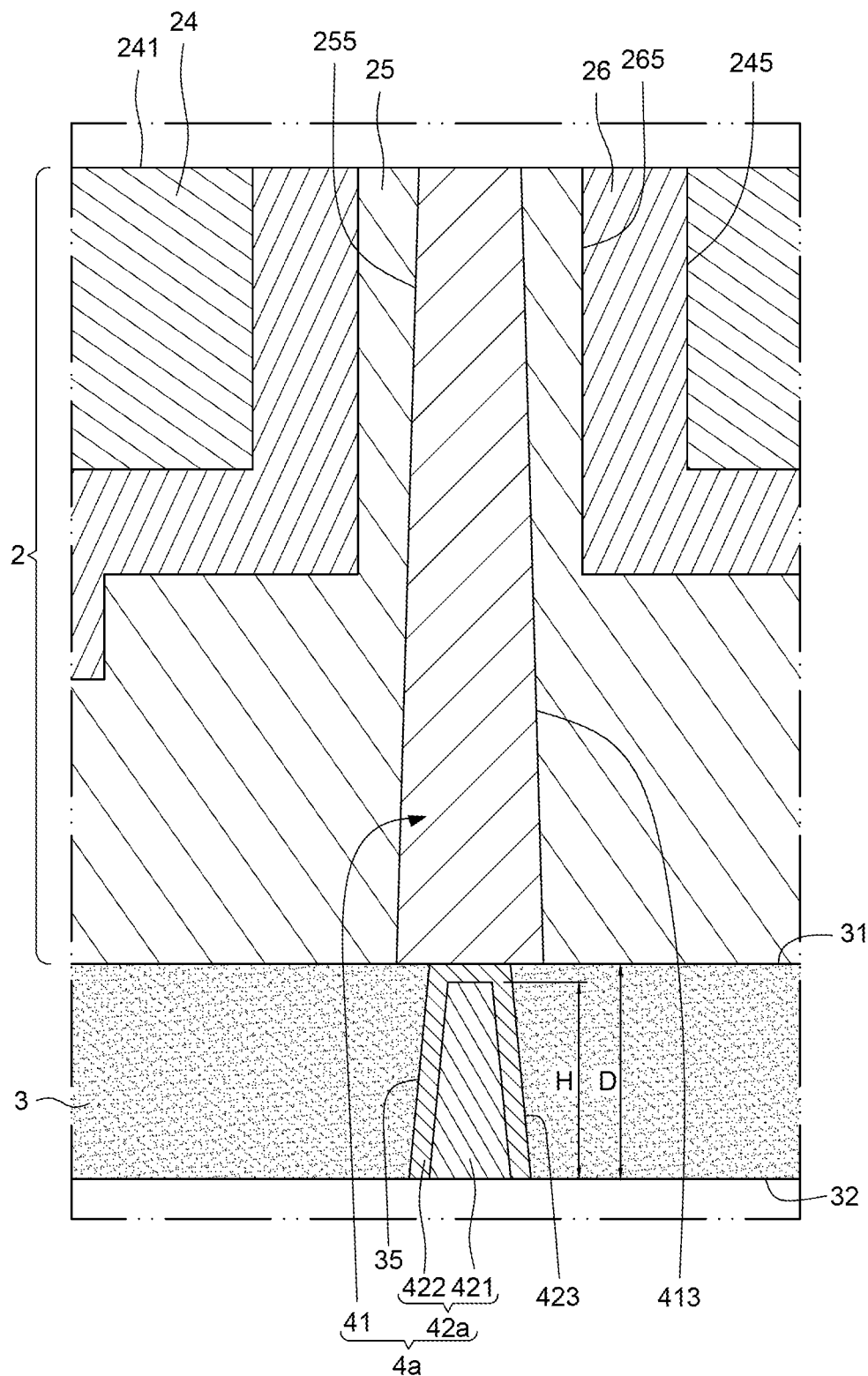
FIG. 3 illustrates an enlarged view of an example of a conductive pillar according to some embodiments of the present disclosure.

FIG. 3 illustrates an enlarged view of an example of a conductive pillar 4a according to some embodiments of the present disclosure. The conductive pillar 4a of FIG. 3 is similar to the conductive pillar 4 of FIG. 2, except for a size (e.g., a width) of the second pillar portion 42a. As shown in FIG. 3, the size (e.g., the width) of the second pillar portion 42a may be less than the size (e.g., the width) of the first pillar portion 41.

Figure 4:
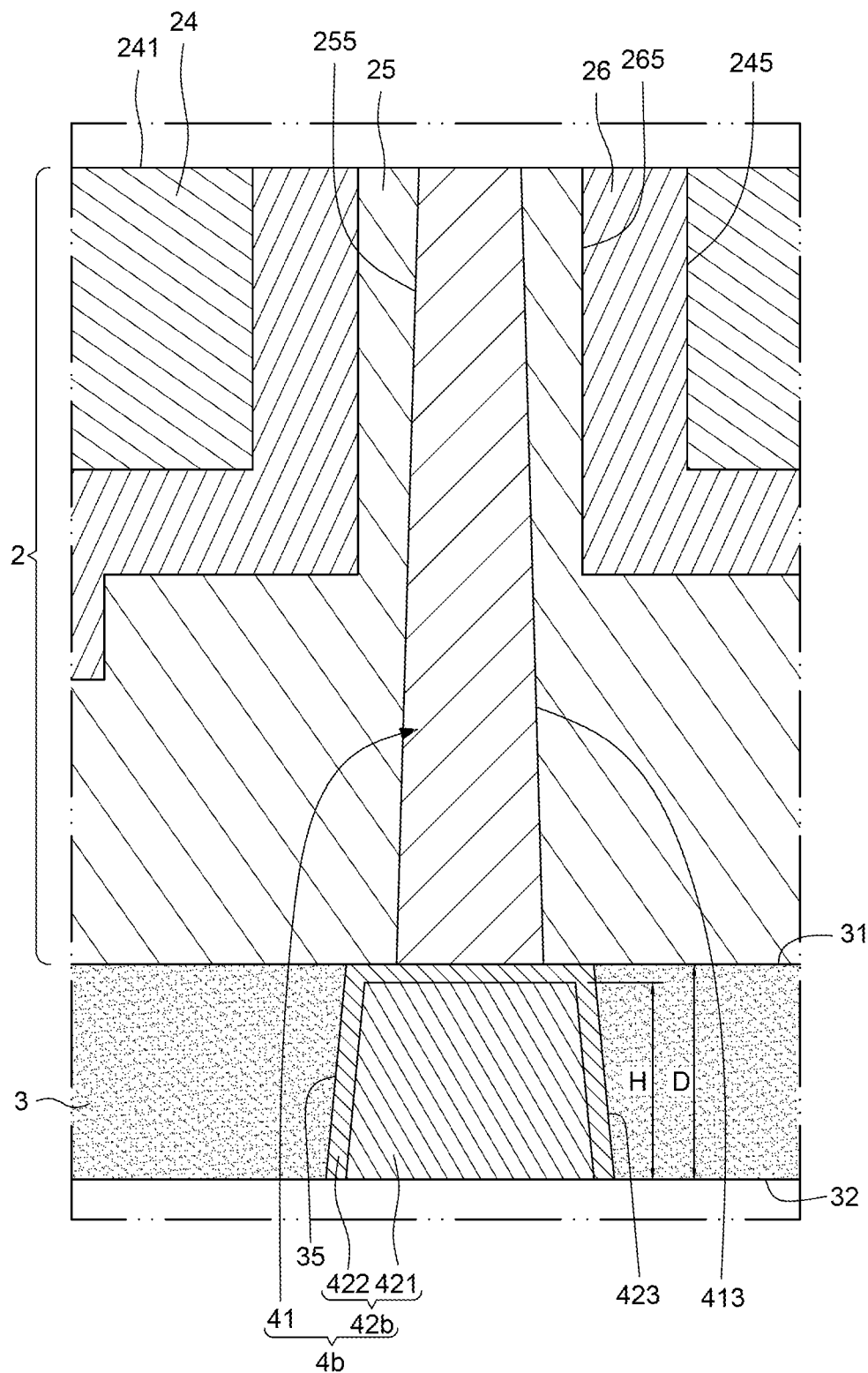
FIG. 4 illustrates an enlarged view of an example of a conductive pillar according to some embodiments of the present disclosure.

FIG. 4 illustrates an enlarged view of an example of a conductive pillar 4b according to some embodiments of the present disclosure. The conductive pillar 4b of FIG. 4 is similar to the conductive pillar 4 of FIG. 2, except for a size (e.g., a width) of the second pillar portion 42b. As shown in FIG. 4, the size (e.g., the width) of the second pillar portion 42b may be greater than the size (e.g., the width) of the first pillar portion 41.

Figure 5:
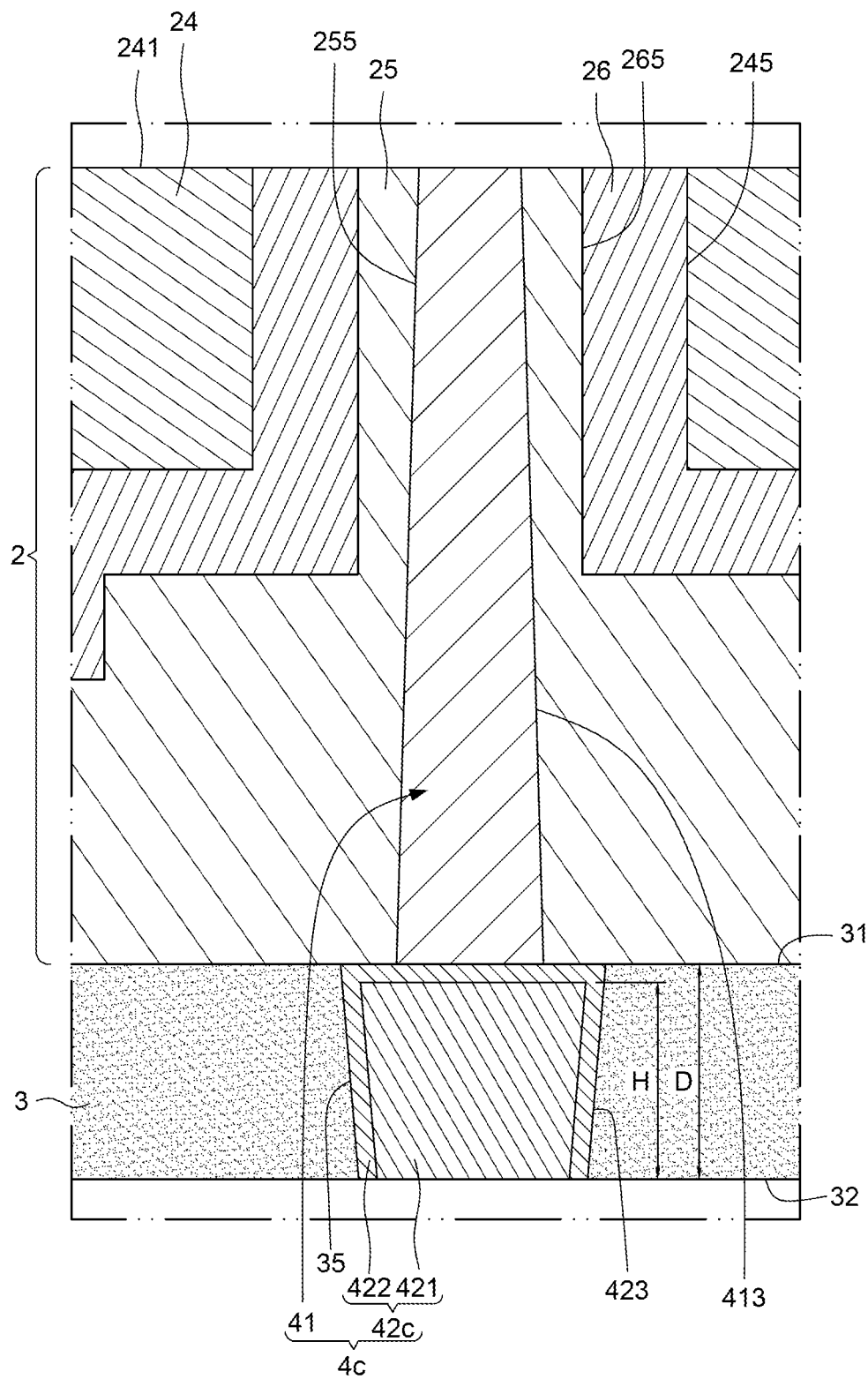
FIG. 5 illustrates an enlarged view of an example of a conductive pillar according to some embodiments of the present disclosure.

FIG. 5 illustrates an enlarged view of an example of a conductive pillar 4c according to some embodiments of the present disclosure. The conductive pillar 4c of FIG. 5 is similar to the conductive pillar 4b of FIG. 4, except for a structure of the second pillar portion 42c. As shown in FIG. 5, the second pillar portion 42c may taper downward form the top surface 31 of the adhesive layer 3 toward the top surface 31 of the adhesive layer 3. That is, the second pillar portion 42c is inverted-trapezoidal in shape.

Figure 6:
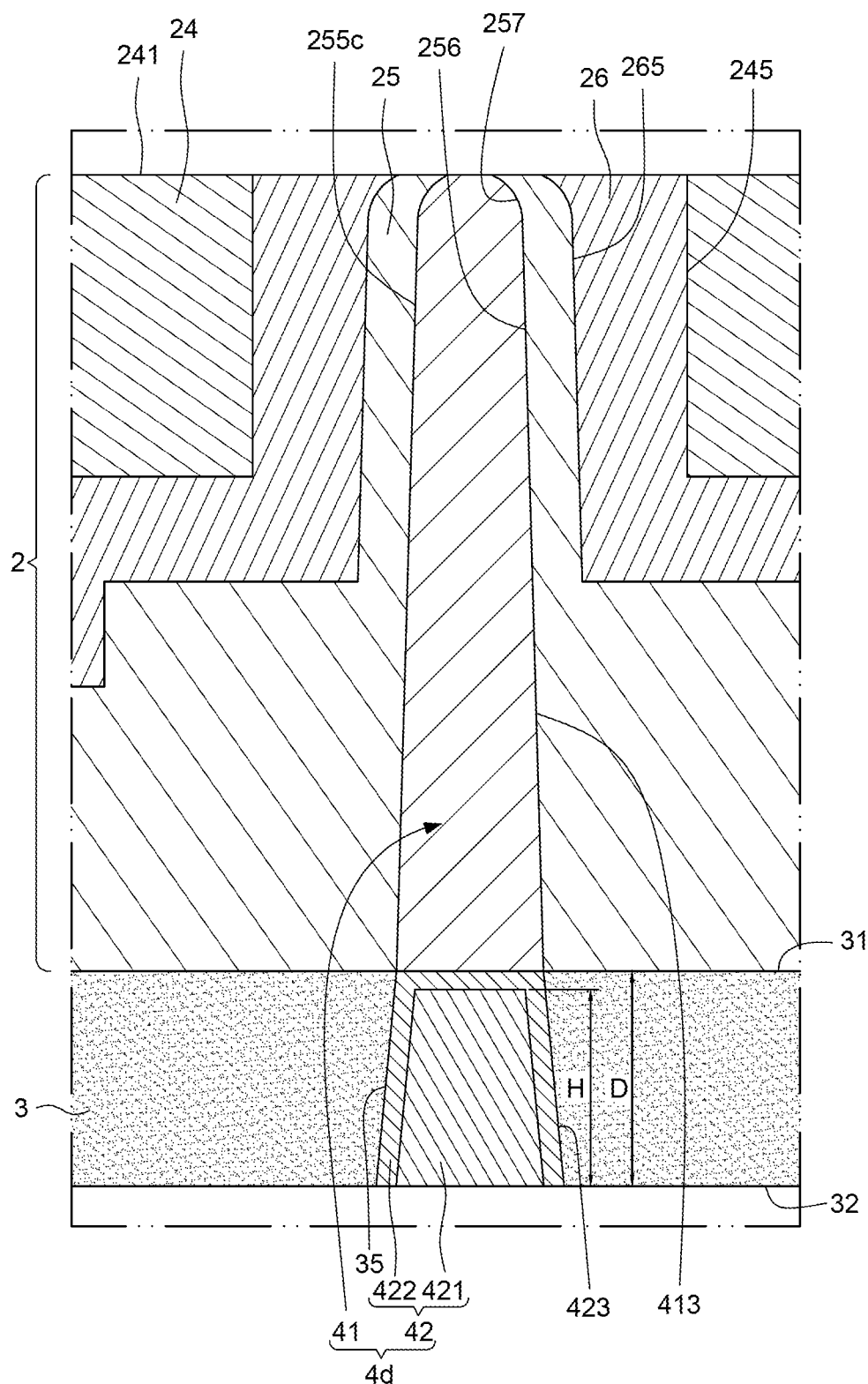
FIG. 6 illustrates an enlarged view of an example of a conductive pillar according to some embodiments of the present disclosure.

FIG. 6 illustrates an enlarged view of an example of a conductive pillar 4d according to some embodiments of the present disclosure. The conductive pillar 4d of FIG. 6 is similar to the conductive pillar 4 of FIG. 2, except for a structure of the through hole 255c of the second dielectric layer 25. As shown in FIG. 6, the through hole 255c of the second dielectric layer 25 has an inner wall 256 and an arc chamfer portion 257. The arc chamfer portion 257 extends from one end of the inner wall 256. The first pillar portion 41 may cover the arc chamfer portion 257 of the through hole 255c.

Figure 7:
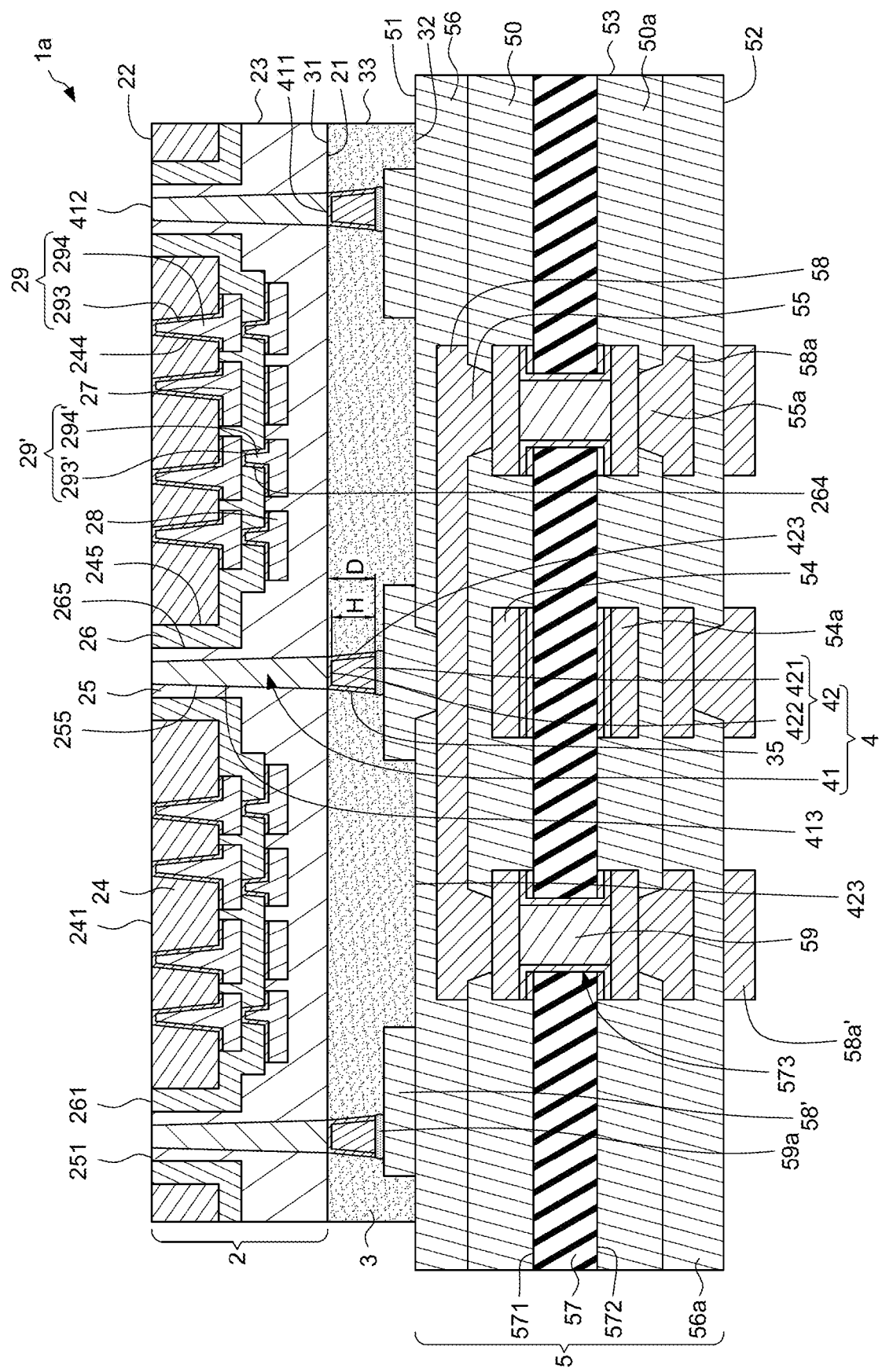
FIG. 7 illustrates a cross-sectional view of a wiring structure according to some embodiments of the present disclosure.

FIG. 7 illustrates a cross-sectional view of a wiring structure 1a according to some embodiments of the present disclosure. The wiring structure 1a is similar to the wiring structure 1 shown in FIG. 1, except that the wiring structure 1a further includes a substrate structure 5. As shown in FIG. 7, the adhesive layer 3 is disposed between the redistribution structure 2 and the substrate structure 5 and bonds the redistribution structure 2 and the substrate structure 5 together. In addition, the redistribution structure 2 may be electrically connected to the substrate structure 5 through the at least one conductive pillar 4. In some embodiments, the at least one conductive pillar 4 may be bonded to the substrate structure 5 through a bonding layer 59a.

In some embodiments, the substrate structure 5 may include at least one dielectric layer (including, for example, one first upper dielectric layer 50, one second upper dielectric layer 56, one first lower dielectric layer 50a and one second lower dielectric layer 56a) and at least one circuit layer (including, for example, one first upper circuit layer 54, two second upper circuit layers 58, 58', one first lower circuit layer 54a and two second lower circuit layers 58a, 58a' formed of a metal, a metal alloy, or other conductive material) in contact with the dielectric layer (e.g., the first upper dielectric layer 50, the second upper dielectric layer 56, the first lower dielectric layer 50a and the second lower dielectric layer 56a). In some embodiments, the substrate structure 5 may be similar to a core substrate that further includes a core portion 57. The substrate structure 5 may be also referred to as "a lower stacked structure" or "a low-density conductive structure" or "a low-density stacked structure". The circuit layer (including, for example, the first upper circuit layer 54, the two second upper circuit layers 58, 58', the first lower circuit layer 54a and the two second lower circuit layers 58a, 58a') of the substrate structure 5 may be also referred to as "a low-density circuit layer". As shown in FIG. 7, the substrate structure 5 has a top surface 51, a bottom surface 52 opposite to the top surface 51, and a peripheral surface 53 extending between the top surface 51 and the bottom surface 52. The substrate structure 5 may include a plurality of dielectric layers (for example, the first upper dielectric layer 50, the second upper dielectric layer 56, the first lower dielectric layer 50a and the second lower dielectric layer 56a), a plurality of circuit layers (for example, the first upper circuit layer 54, the two second upper circuit layers 58, 58', the first lower circuit layer 54a and the two second lower circuit layers 58a, 58a') and at least one inner conductive via (including, for example, a plurality of upper interconnection vias 55 and a plurality of lower interconnection vias 55a). As shown in FIG. 7, the peripheral surface 53 of the substrate structure 5 may be non-coplanar with the peripheral surface 23 of the redistribution structure 2 and the peripheral surface 33 of the adhesive layer 3.

In some embodiments, the second pillar portion 42 of the at least one conductive pillar 4 may be bonded to the circuit layer (e.g., the second upper circuit layer 58') of the substrate structure 5 through the bonding layer 59a.

The core portion 57 has a top surface 571 and a bottom surface 572 opposite to the top surface 571, and defines a plurality of first through holes 573 extending through the core portion 57. An interconnection via 59 is disposed or formed in each first through hole 573 for vertical connection.

The first upper dielectric layer 50 is disposed on the top surface 571 of the core portion 57. The second upper dielectric layer 56 is stacked or disposed on the first upper dielectric layer 50. In addition, the first lower dielectric layer 50a is disposed on the bottom surface 572 of the core portion 57. The second lower dielectric layer 56a is stacked or disposed on the first lower dielectric layer 50a.

A thickness of each of the dielectric layers (including, for example, the first dielectric layer 24, the second dielectric layer 25 and the intermediate dielectric layer 26) of the redistribution structure 2 is less than or equal to about 40%, less than or equal to about 35%, or less than or equal to about 30% of a thickness of each of the dielectric layers 50, 56, 50a, 56a of the substrate structure 5. In addition, a material of the dielectric layers 50, 56, 50a, 56a of the substrate structure 5 may be different from the material of the dielectric layers (including, for example, the first dielectric layer 24, the second dielectric layer 25 and the intermediate dielectric layer 26) of the redistribution structure 2. For example, the material of the dielectric layers 50, 56, 50a, 56a of the substrate structure 5 may be polypropylene (PP) or ajinomoto build-up film (ABF).

An L/S of the first upper circuit layer 54 may be greater than or equal to about 10 µm/about 10 µm. Thus, the L/S of the first upper circuit layer 54 may be greater than or equal to about five times the L/S of the circuit layer (including, for example, the first circuit layer 27 and the second circuit layer 28) of the redistribution structure 2. In some embodiments, the first upper circuit layer 54 is formed or disposed on the top surface 571 of the core portion 57, and covered by the first upper dielectric layer 50.

An L/S of the second upper circuit layer 58 may be greater than or equal to about 10 µm/about 10 µm. Thus, the L/S of the second upper circuit layer 58 may be substantially equal to the L/S of the first upper circuit layer 54, and may be greater than or equal to about five times the L/S of the circuit layer (including, for example, the first circuit layer 27 and the second circuit layer 28) of the redistribution structure 2. In some embodiments, the second upper circuit layer 58 is formed or disposed on the first upper dielectric layer 50, and covered by the second upper dielectric layer 56. In some embodiments, the second upper circuit layer 58 is electrically connected to the first upper circuit layer 54 through the upper interconnection vias 55. That is, the upper interconnection vias 55 are disposed between the second upper circuit layer 58 and the first upper circuit layer 54 for electrically connecting the second upper circuit layer 58 and the first upper circuit layer 54. In some embodiments, the second upper circuit layer 58 and the upper interconnection vias 55 are formed integrally as a monolithic or one-piece structure. Each upper interconnection via 55 tapers downwardly along a direction from the top surface 51 towards the bottom surface 52 of the substrate structure 5.

In addition, in some embodiments, the second upper circuit layer 58' is disposed on and protrudes from the top surface of the second upper dielectric layer 56. In some embodiments, the second upper circuit layer 58 is electrically connected to the second upper circuit layer 58' through the upper interconnection vias 55. In some embodiments, the second upper circuit layer 58' is the topmost circuit layer of the substrate structure 5.

An L/S of the first lower circuit layer 54a may be greater than or equal to about 10 µm/about 10 µm. Thus, the L/S of the first lower circuit layer 54a may be greater than or equal to about five times the L/S of the circuit layer (including, for example, the first circuit layer 27 and the second circuit layer 28) of the redistribution structure 2. In some embodiments, the first lower circuit layer 54a is formed or disposed on the bottom surface 572 of the core portion 57, and covered by the first lower dielectric layer 50a.

An L/S of the second lower circuit layer 58a may be greater than or equal to about 10 µm/about 10 µm. Thus, the L/S of the second lower circuit layer 58a may be substantially equal to the L/S of the first upper circuit layer 54, and may be greater than or equal to about five times the L/S of the circuit layer (including, for example, the first circuit layer 27 and the second circuit layer 28) of the redistribution structure 2. In some embodiments, the second lower circuit layer 58a is formed or disposed on the first lower dielectric layer 50a, and covered by the second lower dielectric layer 56a. In some embodiments, the second lower circuit layer 58a is electrically connected to the first lower circuit layer 54a through the lower interconnection vias 55a. That is, the lower interconnection vias 55a are disposed between the second lower circuit layer 58a and the first lower circuit layer 54a for electrically connecting the second lower circuit layer 58a and the first lower circuit layer 54a. In some embodiments, the second lower circuit layer 58a and the lower interconnection vias 55a are formed integrally as a monolithic or one-piece structure. The lower interconnection via 55a tapers upwardly along a direction from the bottom surface 52 towards the top surface 51 of the substrate structure 5.

In addition, in some embodiments, the second lower circuit layer 58a' is disposed on and protrudes from the bottom surface of the second lower dielectric layer 56a. In some embodiments, the second lower circuit layer 58a' is electrically connected to the second lower circuit layer 58a through the lower interconnection vias 55a. That is, the lower interconnection vias 55a are disposed between the second lower circuit layers 58a, 38a' for electrically connecting the second lower circuit layers 58a, 58a'. In some embodiments, the second lower circuit layer 58a' is the bottommost low-density circuit layer of the substrate structure 5. Further, each interconnection via 59 electrically connects the first upper circuit layer 54 and the first lower circuit layer 54a.

Figure 7A:
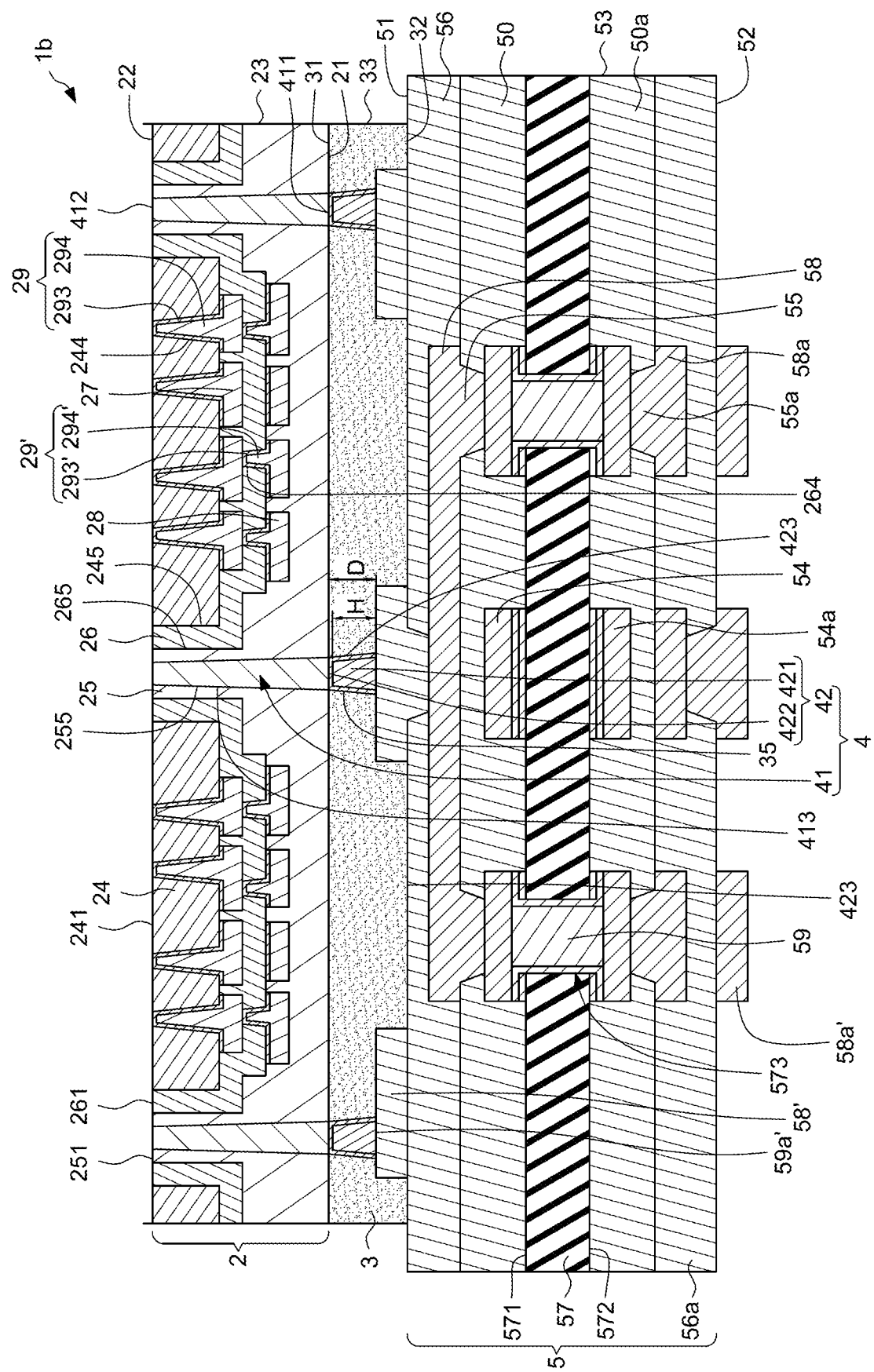
FIG. 7A illustrates a cross-sectional view of a wiring structure according to some embodiments of the present disclosure.

FIG. 7A illustrates a cross-sectional view of a wiring structure 1b according to some embodiments of the present disclosure. The wiring structure 1b is similar to the wiring structure 1a shown in FIG. 7, except that the bonding layer 59a is omitted. As shown in FIG. 7A, the at least one conductive pillar 4 may be directly bonded to the substrate structure 5 (e.g., the second upper circuit layer 58'). In addition, a bonding surface 59a' may be between the at least one conductive pillar 4 and the substrate structure 5 (e.g., the second upper circuit layer 58').

Figure 8:
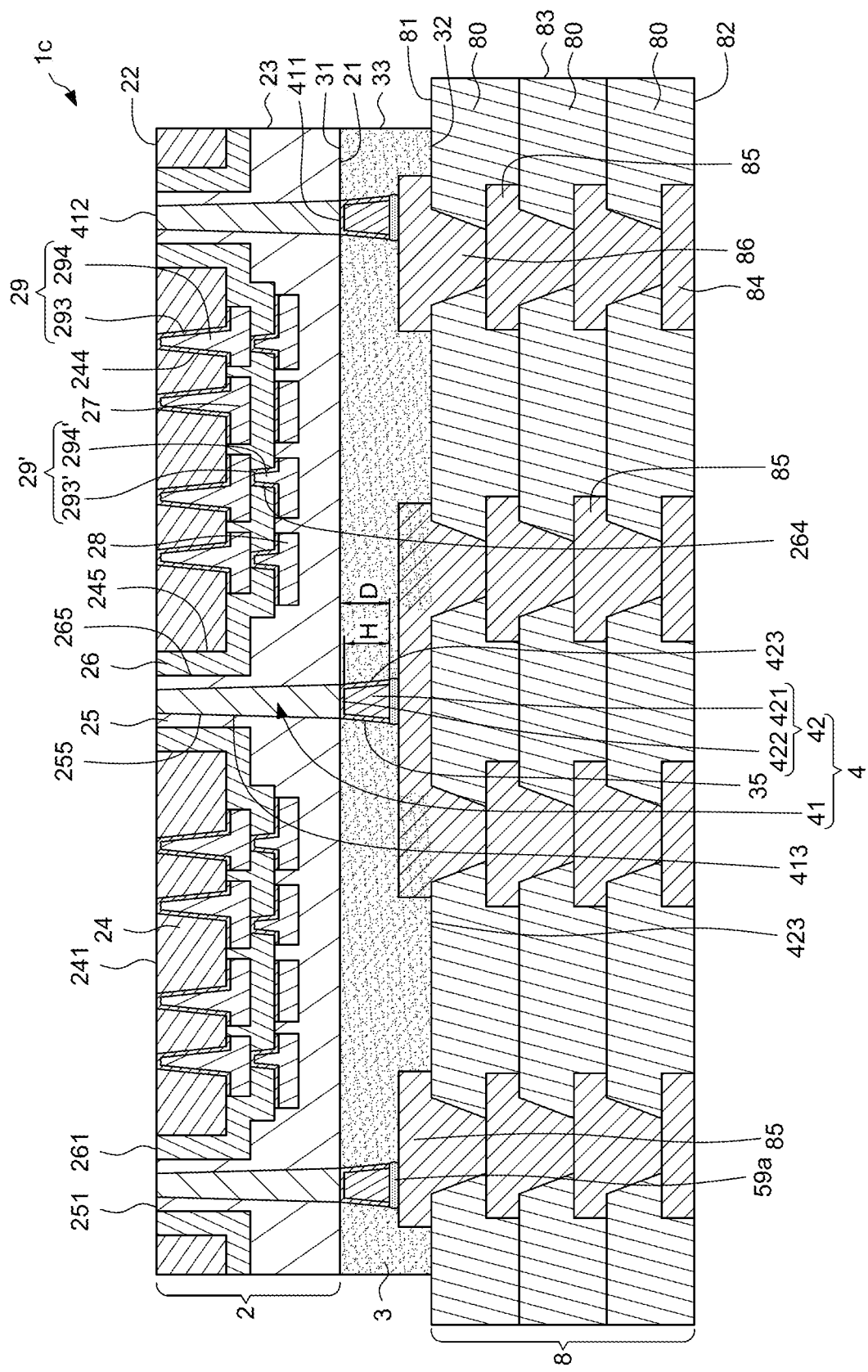
FIG. 8 illustrates a cross-sectional view of a wiring structure according to some embodiments of the present disclosure.

FIG. 8 illustrates a cross-sectional view of a wiring structure 1c according to some embodiments of the present disclosure. The wiring structure 1c is similar to the wiring structure 1a shown in FIG. 7, except for a structure of the substrate structure 8. In some embodiments, as shown in FIG. 8, the substrate structure 8 may be similar to a coreless substrate.

The substrate structure 8 may include at least one dielectric layer (including, for example, three dielectric layers 80), at least one circuit layer (including, for example, three upper circuit layers 85 and one lower circuit layer 84 formed of a metal, a metal alloy, or other conductive material) in contact with the dielectric layer(s) 80 and at least one inner conductive via 86 (including, for example, a plurality of inner conductive vias 86). The substrate structure 8 may be also referred to as "a lower stacked structure" or "a low-density conductive structure" or "a low-density stacked structure". The circuit layers 85, 84 of the substrate structure 8 may be also referred to as "a low-density circuit layer". As shown in FIG. 8, the substrate structure 8 has a top surface 81, a bottom surface 82 opposite to the top surface 81, and a peripheral surface 83 extending between the top surface 81 and the bottom surface 82. In some embodiments, the peripheral surface 83 of the substrate structure 8 may be non-coplanar with the peripheral surface 23 of the redistribution structure 2 and the peripheral surface 33 of the adhesive layer 3.

The lower circuit layer 84 is embedded in the bottommost dielectric layer 80, and exposed from the bottom surface of the bottommost dielectric layer 80. The upper circuit layers 85 are disposed on the dielectric layers 80. Some of the inner conductive vias 86 are disposed between two adjacent upper circuit layers 85 for electrically connecting the two upper circuit layers 85. The inner conductive vias 86 and the upper circuit layer 85 may be formed integrally and concurrently. Some of the inner conductive vias 86 are disposed between the upper circuit layer 85 and the lower circuit layer 84 for electrically connecting the upper circuit layer 85 and the lower circuit layer 84. Each inner conductive via 86 tapers downwardly along a direction from the top surface 81 towards the bottom surface 82 of the substrate structure 8. Thus, a tapering direction of the inner conductive via 86 of the substrate structure 8 is different from the tapering direction of the inner conductive vias (including, for example, the inner conductive vias 29, 29') of the redistribution structure 2.

A thickness of each of the dielectric layers (including, for example, the first dielectric layer 24, the second dielectric layer 25 and the intermediate dielectric layer 26) of the redistribution structure 2 is less than or equal to about 40%, less than or equal to about 35%, or less than or equal to about 30% of a thickness of each of the dielectric layers 80 of the substrate structure 8. In addition, a material of the dielectric layers 80 of the substrate structure 8 may be different from the material of the dielectric layers (including, for example, the first dielectric layer 24, the second dielectric layer 25 and the intermediate dielectric layer 26) of the redistribution structure 2. For example, the material of the dielectric layers 80 of the substrate structure 8 may be polypropylene (PP) or ajinomoto build-up film (ABF).

An L/S of the upper circuit layer 85 and the lower circuit layer 84 may be greater than or equal to about 10 μm/about 10 μm. Thus, the L/S of the upper circuit layer 85 and the lower circuit layer 84 may be greater than or equal to about five times the L/S of the circuit layer (including, for example, the first circuit layer 27 and the second circuit layer 28) of the redistribution structure 2. In addition, in some embodiments, the topmost upper circuit layer 85 is disposed on and protrudes from the top surface of the topmost dielectric layer 80 (i.e., the top surface 81 of the substrate structure 8).

Figure 9:
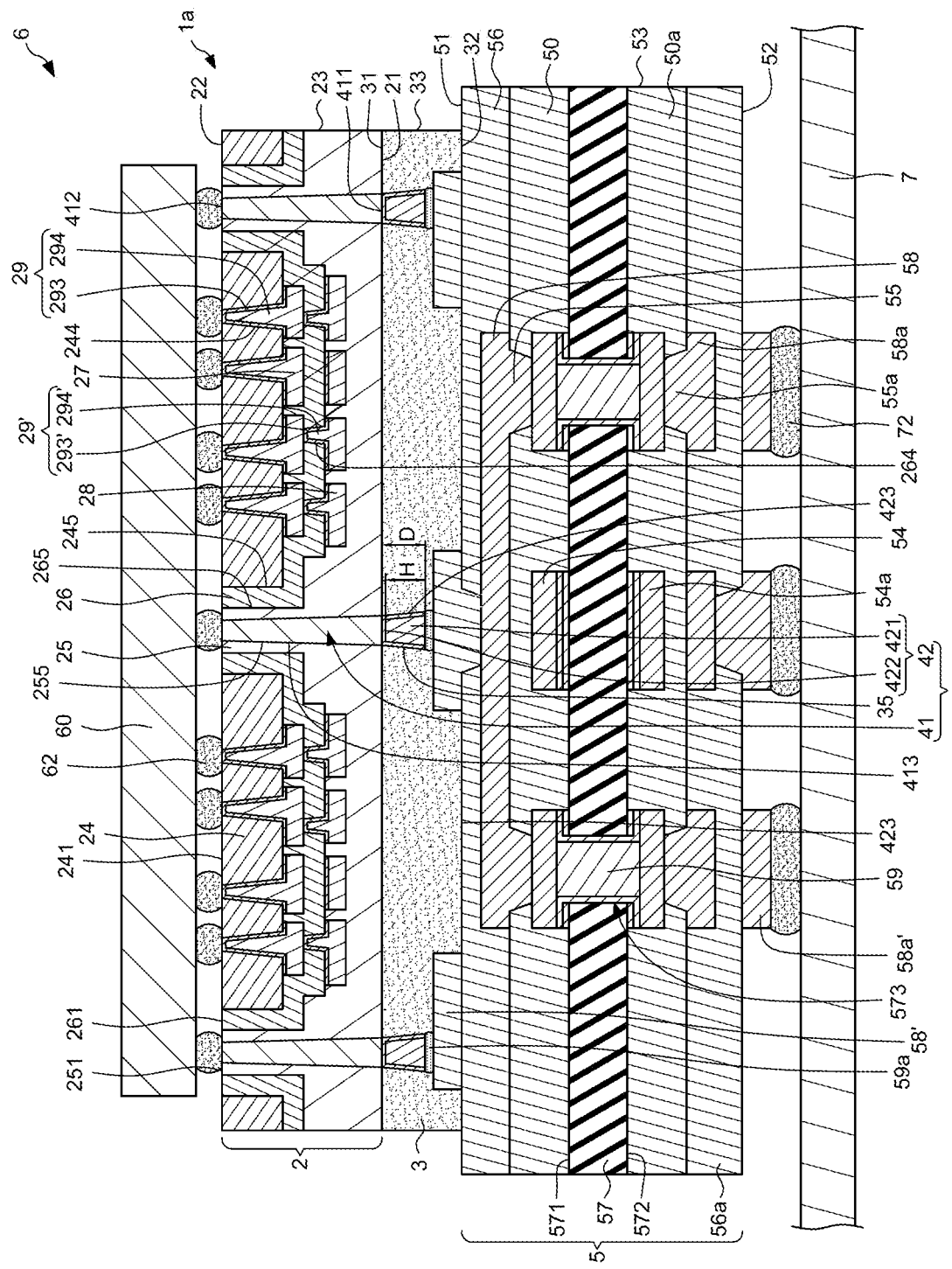
FIG. 9 illustrates a cross-sectional view of a bonding of a package structure and a mother board according to some embodiments of the present disclosure.

FIG. 9 illustrates a cross-sectional view of a bonding of a package structure 6 and a mother board 7 according to some embodiments of the present disclosure. The package structure 6 includes a wiring structure 1a, a semiconductor device 60, a plurality of first connecting elements 62 and a plurality of second connecting elements 72. The wiring structure 1a is similar to the wiring structure 1a shown in FIG. 7. The semiconductor device 60 is electrically connected and bonded to the conductive pillar(s) 4 (e.g., the first pillar portion(s) 41) and the exposed inner conductive vias (e.g., the inner conductive vias 29) of the redistribution structure 2 through the first connecting elements 62 (e.g., solder bumps or other conductive bumps). The second lower circuit layer 58a' of the substrate structure 5 is electrically connected and bonded to the mother board 7 (e.g., a printed circuit board (PCB)) through the second connecting elements 72 (e.g., solder bumps or other conductive bumps).

FIG. 10 through FIG. 26 illustrate a method for manufacturing a wiring structure according to some embodiments of the present disclosure. In some embodiments, the method is for manufacturing the wiring structure 1 shown in FIG. 1.

Figure 10:
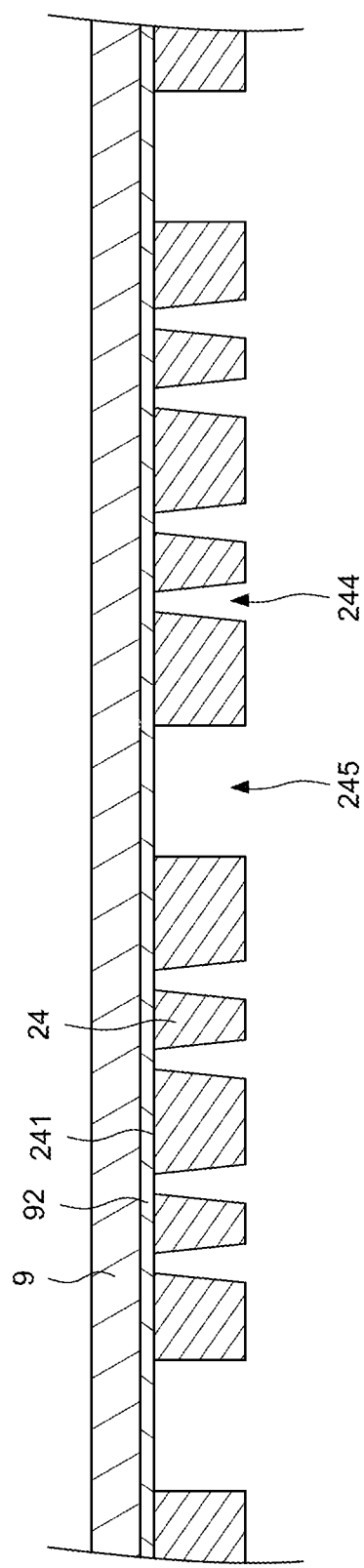
FIG. 10 illustrates one or more stages of an example of a method for manufacturing a wiring structure according to some embodiments of the present disclosure.

Referring to FIG. 10 through FIG. 16, a redistribution structure 2 is formed on a carrier 9. The redistribution structure 2 is manufactured as follows. Referring to FIG. 10, a carrier 9 is provided. The carrier 9 may be a glass carrier, and may be in a wafer type, a panel type or a strip type. In some embodiments, a seed layer 92 may be formed on the carrier 9. Then, a patterned first dielectric layer 24 is formed on the seed layer 92 of the carrier 9. The patterned first dielectric layer 24 defines a plurality of first via holes 244 and a plurality of first openings 245 extending through the first dielectric layer 24. A width of the first opening 245 may be greater than a width of the first via hole 244.

Figure 11:
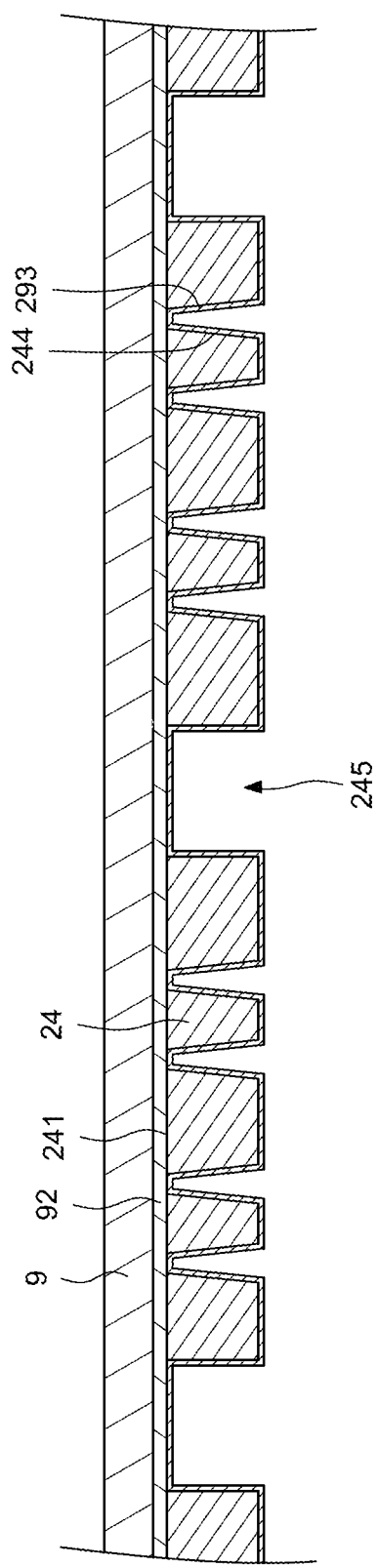
FIG. 11 illustrates one or more stages of an example of a method for manufacturing a wiring structure according to some embodiments of the present disclosure.
Figure 12:
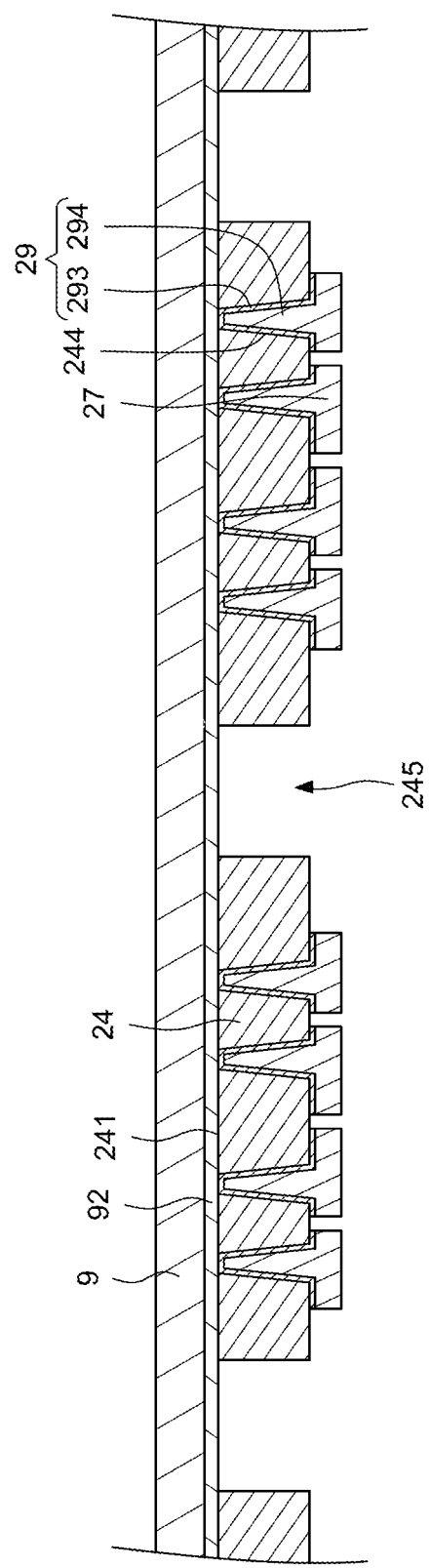
FIG. 12 illustrates one or more stages of an example of a method for manufacturing a wiring structure according to some embodiments of the present disclosure.

Referring to FIG. 11 through FIG. 12, a plurality of inner conductive vias 29 are formed in the first via holes 244 of the first dielectric layer 24, and a first circuit layer 27 is formed on the first dielectric layer 24.

Referring to FIG. 11, a seed layer 293 is formed on the first dielectric layer 24 and in the first via holes 244 by a physical vapor deposition (PVD) technique or other suitable techniques.

Referring to FIG. 12, a patterned conductive material 294 (e.g., a metallic material) is formed in the first via holes 244 and on the seed layer 293. Then, portions of the seed layer 293 that are not covered by the conductive material 294 are removed by an etching technique or other suitable techniques. Meanwhile, a first circuit layer 27 and a plurality of inner conductive vias 29 are formed.

Figure 13:
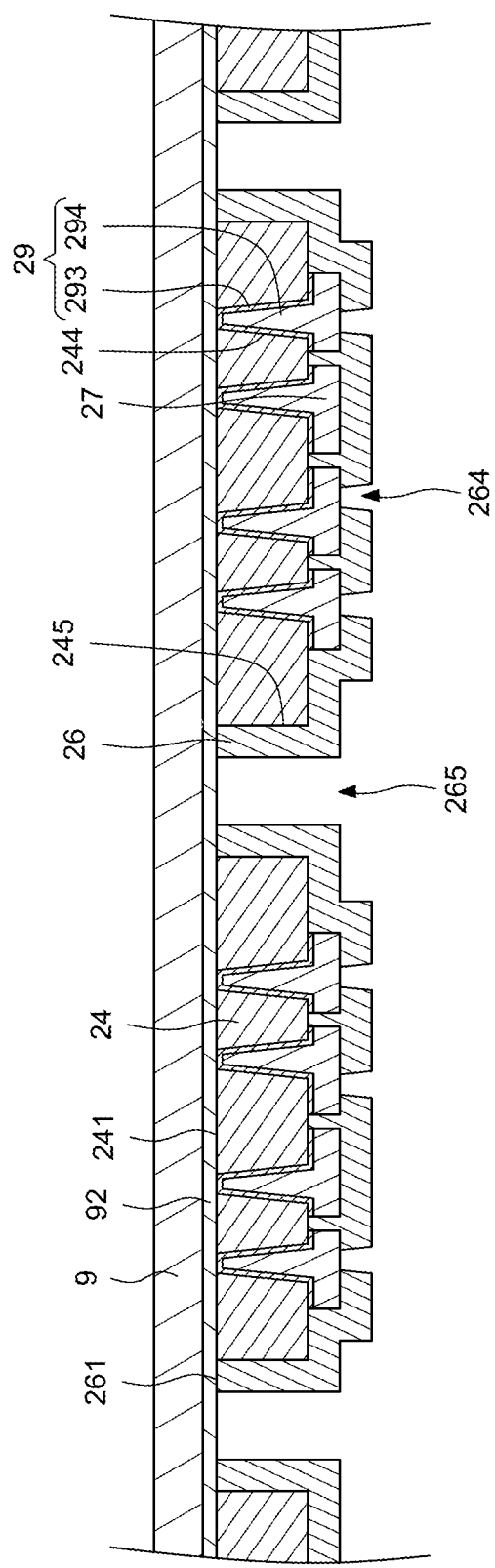
FIG. 13 illustrates one or more stages of an example of a method for manufacturing a wiring structure according to some embodiments of the present disclosure.

Referring to FIG. 13, a patterned intermediate dielectric layer 26 is formed on the first dielectric layer 24 and the first circuit layer 27 to cover the first circuit layer 27 and fill the first openings 245 of the first dielectric layer 24. That is, a portion of the patterned intermediate dielectric layer 26 extends into the first openings 245 of the first dielectric layer 24. The patterned intermediate dielectric layer 26 defines a plurality of second via holes 264 extending through the intermediate dielectric layer 26. In addition, the extending portions of the intermediate dielectric layer 26 in the first openings 245 of the first dielectric layer 24 define a plurality of second openings 265 extending through the extending portion of the intermediate dielectric layer 26. A width of the second opening 265 may be greater than a width of the second via hole 264.

Figure 14:
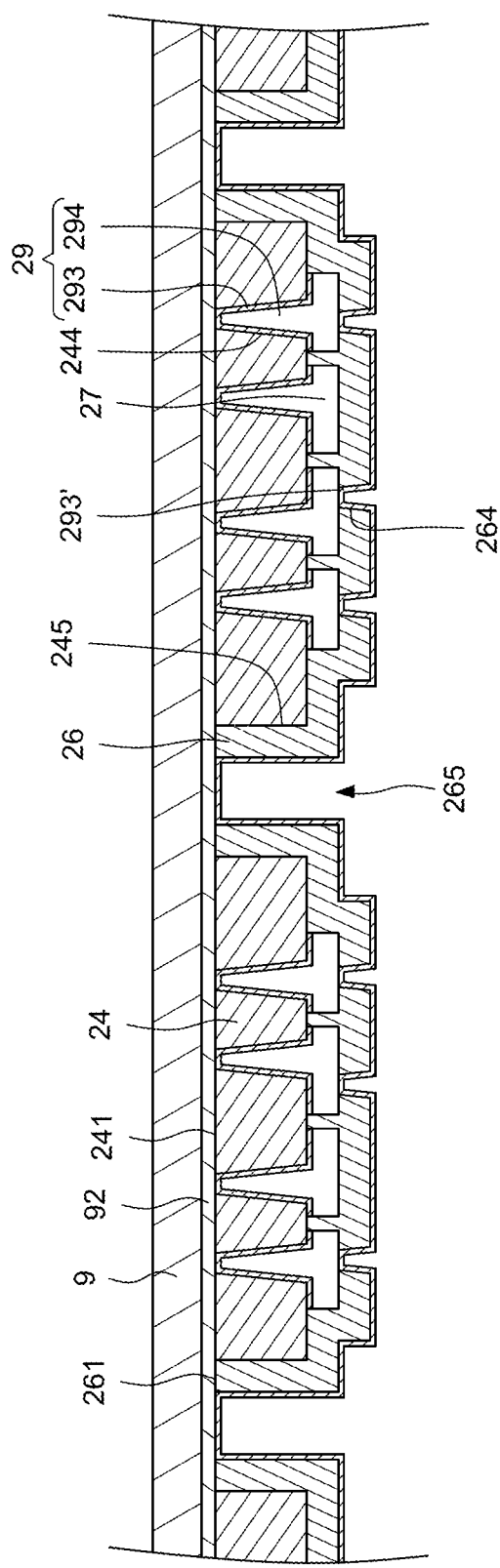
FIG. 14 illustrates one or more stages of an example of a method for manufacturing a wiring structure according to some embodiments of the present disclosure.
Figure 15:
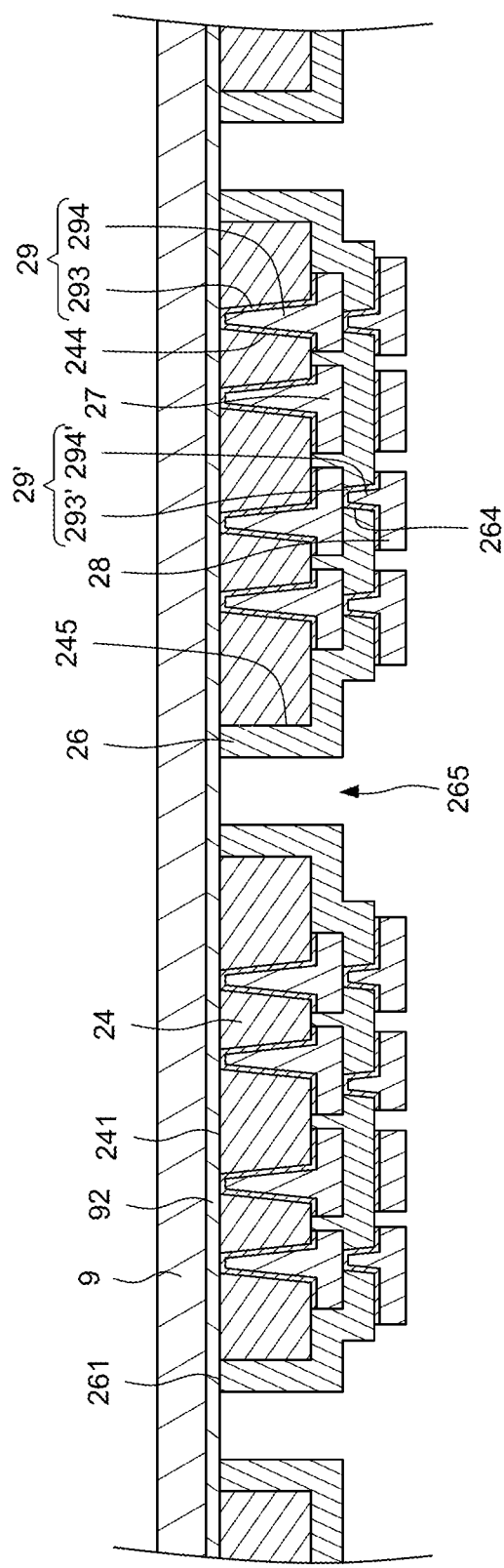
FIG. 15 illustrates one or more stages of an example of a method for manufacturing a wiring structure according to some embodiments of the present disclosure.

Referring to FIG. 14 through FIG. 15, a plurality of inner conductive vias 29' are formed in the second via holes 264 of the intermediate dielectric layer 26, and a second circuit layer 28 is formed on the intermediate dielectric layer 26.

Referring to FIG. 14, a seed layer 293' is formed on the intermediate dielectric layer 26 and in the second via holes 264 by a physical vapor deposition (PVD) technique or other suitable techniques.

Referring to FIG. 15, a patterned conductive material 294' (e.g., a metallic material) is formed in the the second via holes 264 and on the seed layer 293'. Then, portions of the seed layer 293' that are not covered by the conductive material 294' are removed by an etching technique or other suitable techniques. Meanwhile, a second circuit layer 28 and a plurality of inner conductive vias 29' are formed.

Figure 16:
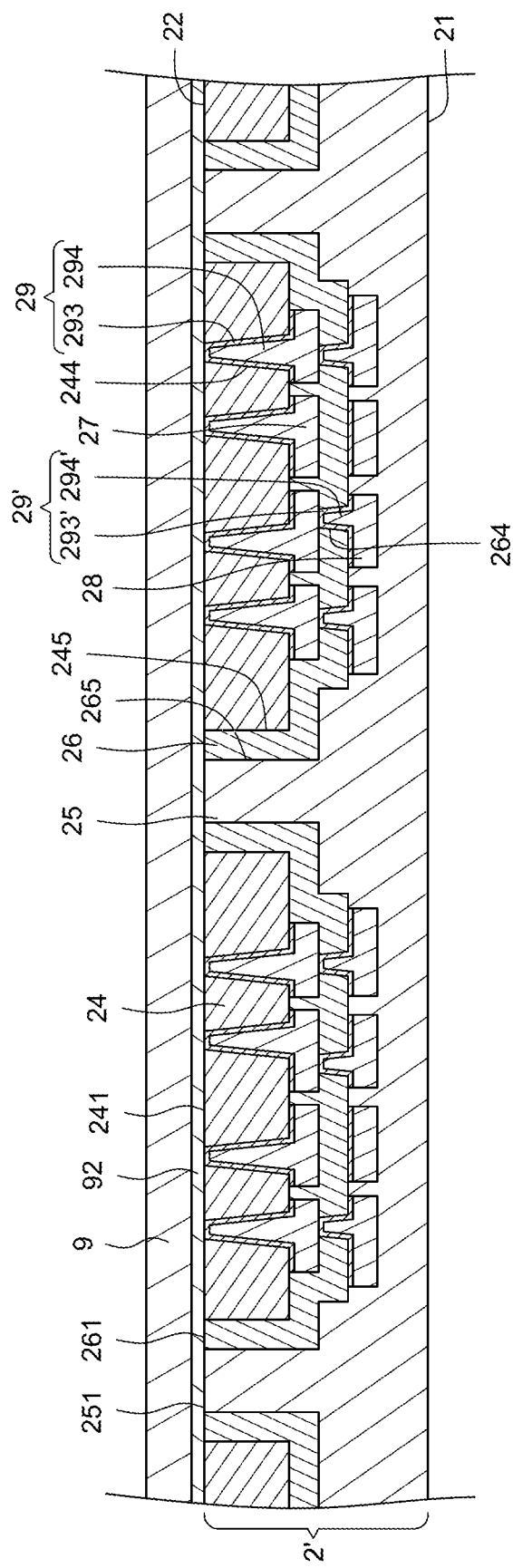
FIG. 16 illustrates one or more stages of an example of a method for manufacturing a wiring structure according to some embodiments of the present disclosure.

Referring to FIG. 16, a second dielectric layer 25 is formed on the intermediate dielectric layer 26 and the second circuit layer 28 to cover the second circuit layer 28 and fill the second openings 265 of the intermediate dielectric layer 26. That is, a portion of the second dielectric layer 25 fills the second openings 265 of the intermediate dielectric layer 26 and the first openings 245 of the first dielectric layer 24. Meanwhile, a redistribution structure 2' is formed on the carrier 9.

Figure 17:
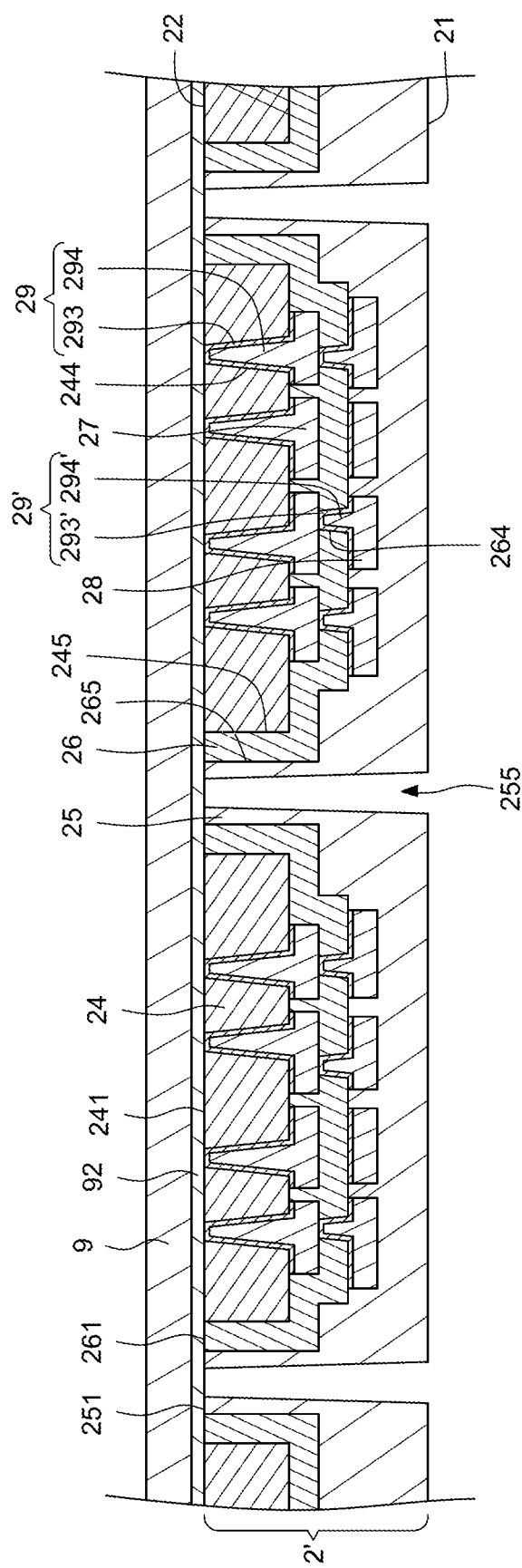
FIG. 17 illustrates one or more stages of an example of a method for manufacturing a wiring structure according to some embodiments of the present disclosure.

Referring to FIG. 17, a plurality of through holes 255 are formed to extend through the filled portions of the second dielectric layer 25 in the second openings 265 of the intermediate dielectric layer 26 and the first openings 245 of the first dielectric layer 24. That is, the through holes 255 of the second dielectric layer 25 are formed in the second openings 265 of the intermediate dielectric layer 26. As shown in FIG. 17, a size (e.g., a width) of each of the through holes 255 of the second dielectric layer 25 is less than a size (e.g., a width) of each of the second openings 265 of the intermediate dielectric layer 26, and the size (e.g., the width) of each of the second openings 265 of the intermediate dielectric layer 26 is less than a size (e.g., a width) of each of the first openings 245 of the first dielectric layer 24. That is, the size (e.g., the width) of each of the first openings 245 of the first dielectric layer 24 may be reduced to the size (e.g., the width) of each of the through holes 255 of the second dielectric layer 25 through the extending portion of the intermediate dielectric layer 26 and the filled portion of the second dielectric layer 25.

Figure 18:
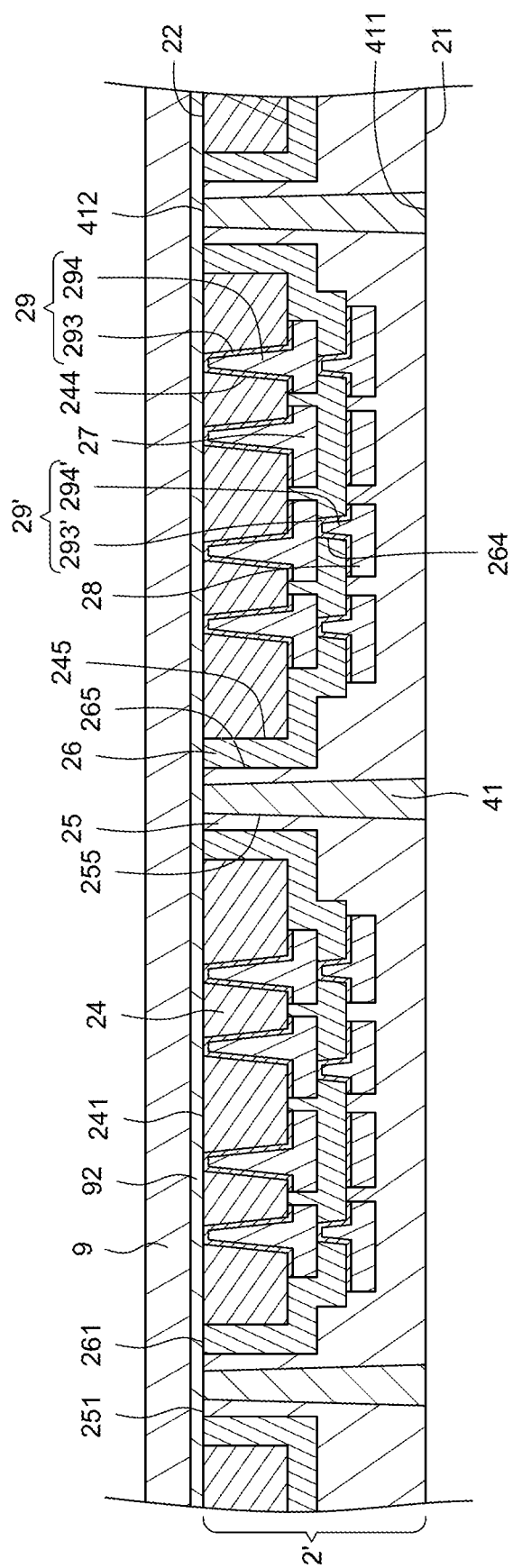
FIG. 18 illustrates one or more stages of an example of a method for manufacturing a wiring structure according to some embodiments of the present disclosure.

Referring to FIG. 18, a plurality of first pillar portions 41 are formed in the through holes 255 of the second dielectric layer 25 by a plating technique or other suitable techniques. The first pillar portions 41 are directly in contact with the second dielectric layer 25. That is, there may be no seed layer between the first pillar portion 41 and the second dielectric layer 25. The first pillar portion 41 has a first end surface 411 and a second end surface 412 opposite to the first end surface 411. In some embodiments, the first end surface 411 of the first pillar portion 41 may be substantially coplanar with a first surface 21 (i.e., a bottom surface) of the redistribution structure 2', and the second end surface 412 of the first pillar portion 41 may be substantially coplanar with a second surface 22 (i.e., a top surface) of the redistribution structure 2'.

Figure 19:
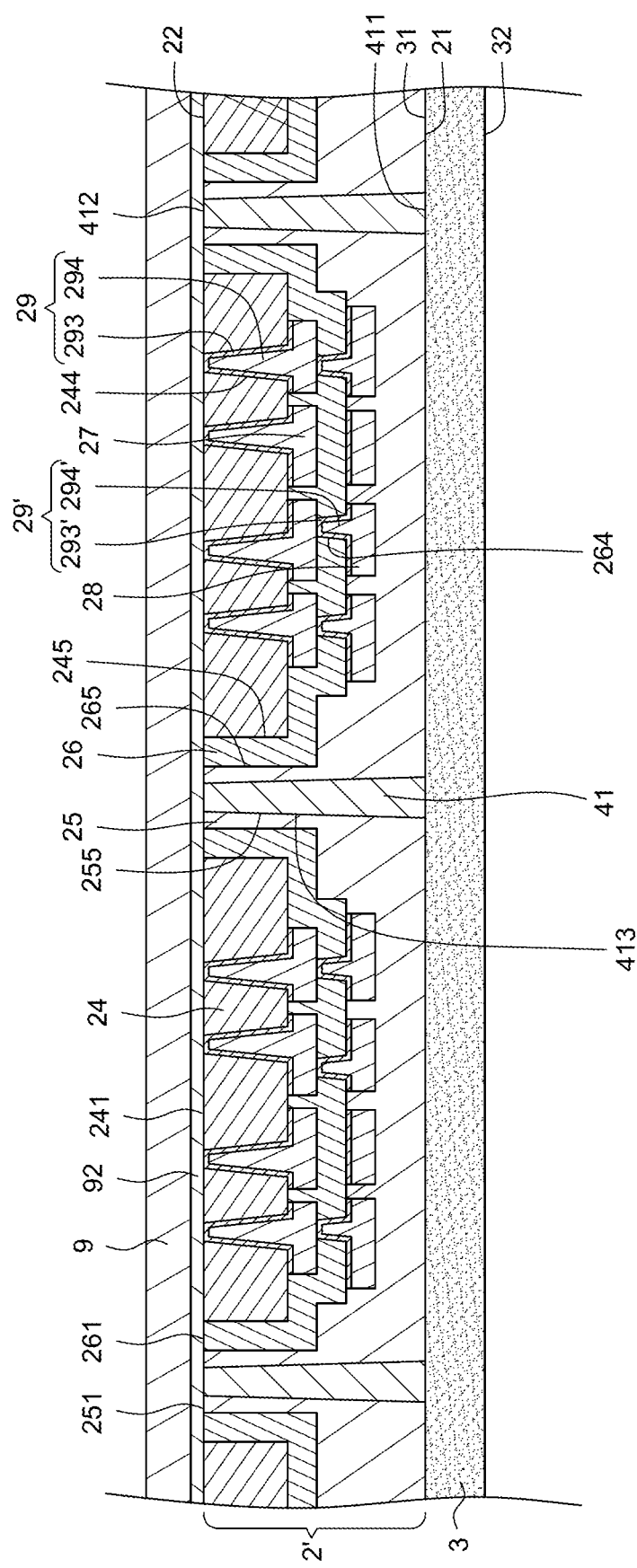
FIG. 19 illustrates one or more stages of an example of a method for manufacturing a wiring structure according to some embodiments of the present disclosure.

Referring to FIG. 19, an adhesive layer 3 is formed to cover the second dielectric layer 25 (e.g., a bottom surface) and the first pillar portions 41 (e.g., the first end surfaces 411). The adhesive layer 3 has a top surface 31 attached to the second dielectric layer 25 and a bottom surface 32 opposite to the top surface 31. A material of the adhesive layer 3 is transparent, and can be seen through by human eyes or machine. In addition, the material of adhesive layer 3 may be different from the material of the dielectric layers (including, for example, the first dielectric layer 24, the second dielectric layer 25 and the intermediate dielectric layer 26) of the redistribution structure 2'.

Figure 20:
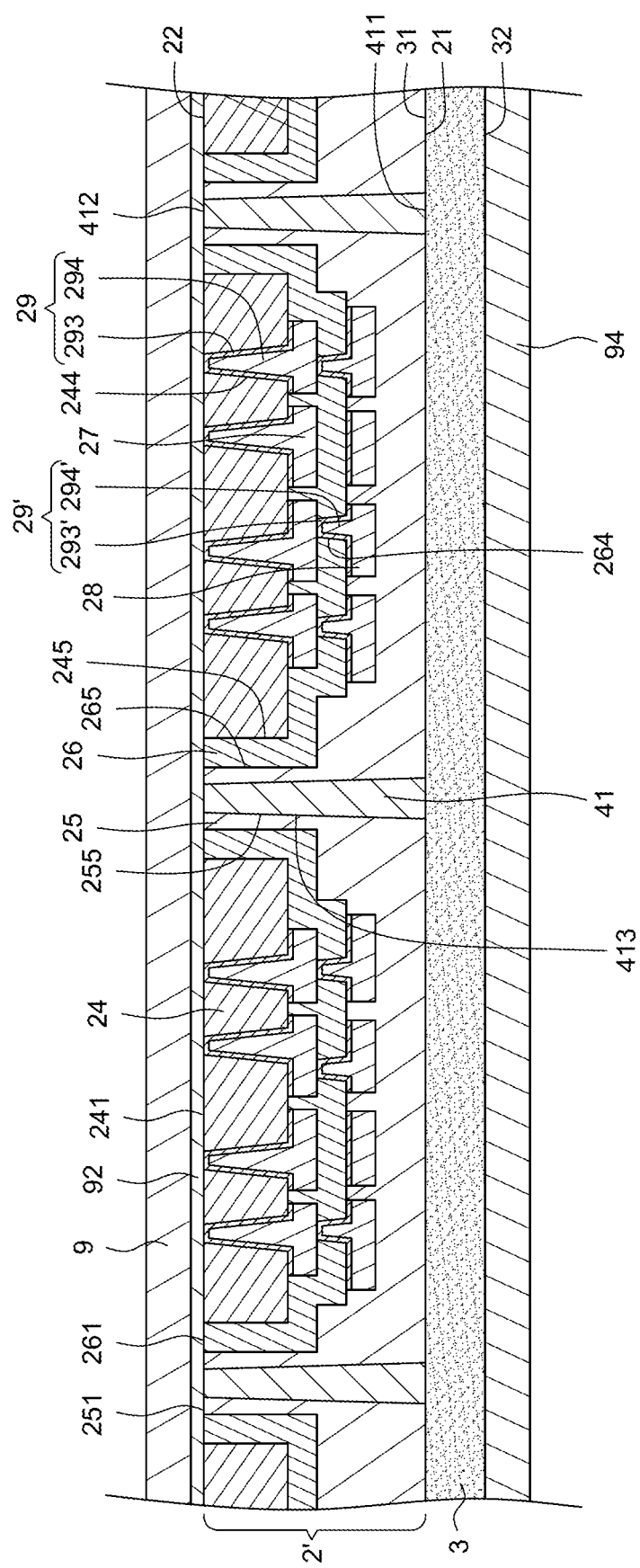
FIG. 20 illustrates one or more stages of an example of a method for manufacturing a wiring structure according to some embodiments of the present disclosure.

Referring to FIG. 20, a metal mask 94 is disposed on the bottom surface 32 of the adhesive layer 3.

Figure 21:
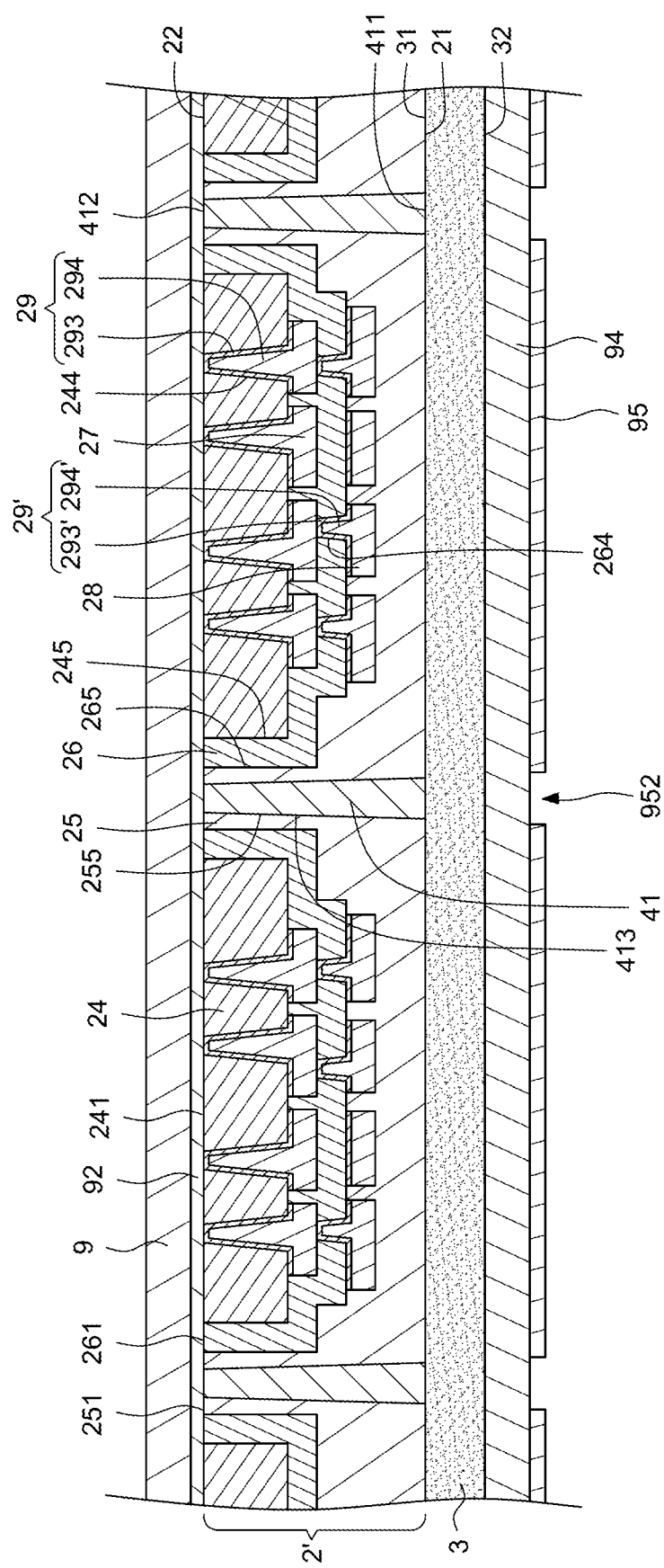
FIG. 21 illustrates one or more stages of an example of a method for manufacturing a wiring structure according to some embodiments of the present disclosure.

Referring to FIG. 21, a photoresist layer 95 is formed or disposed on a bottom surface of the metal mask 94. Then, the photoresist layer 95 is patterned to form a plurality of openings 952 to expose portions of the metal mask 94 by an exposure and development technique or other suitable techniques.

Figure 22:
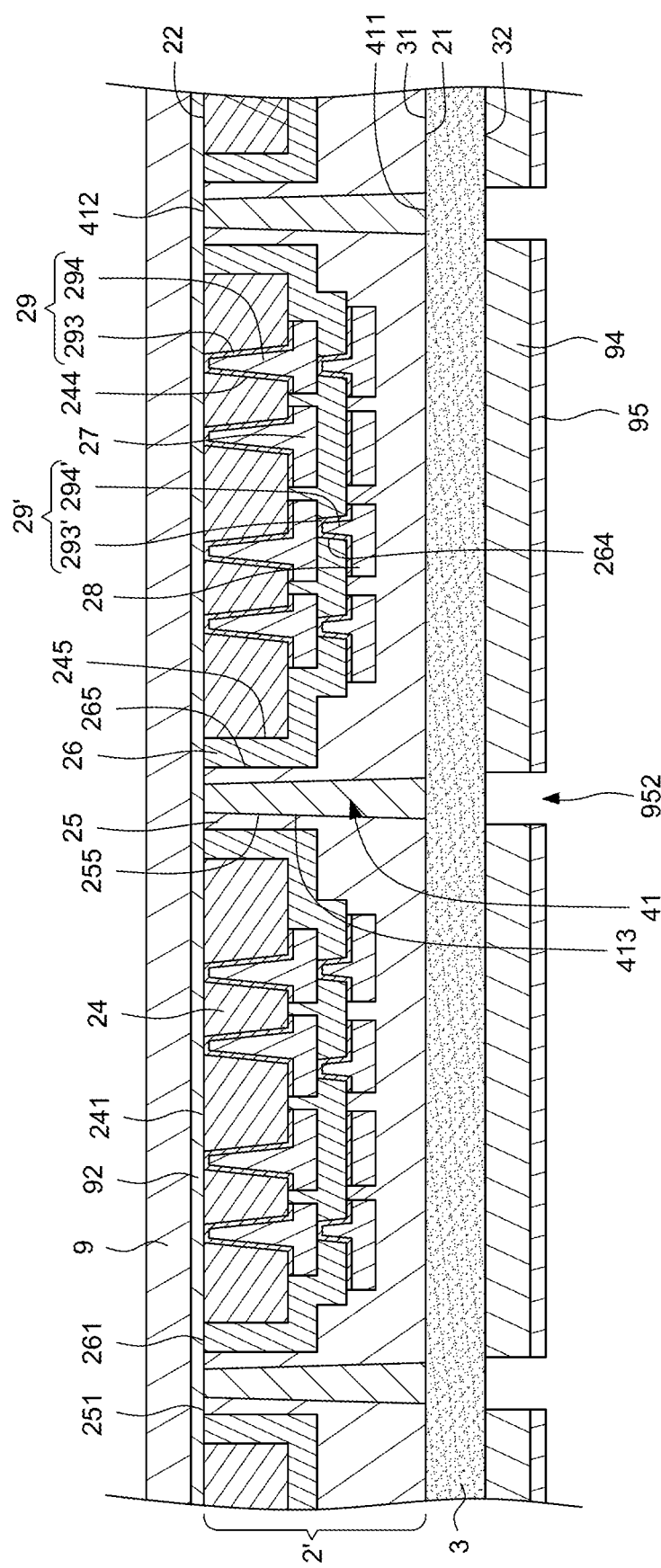
FIG. 22 illustrates one or more stages of an example of a method for manufacturing a wiring structure according to some embodiments of the present disclosure.

Referring to FIG. 22, the exposed portions of the metal mask 94 are removed through the openings 952 to expose portions of the adhesive layer 3 by etching technique or other suitable techniques.

Figure 23:
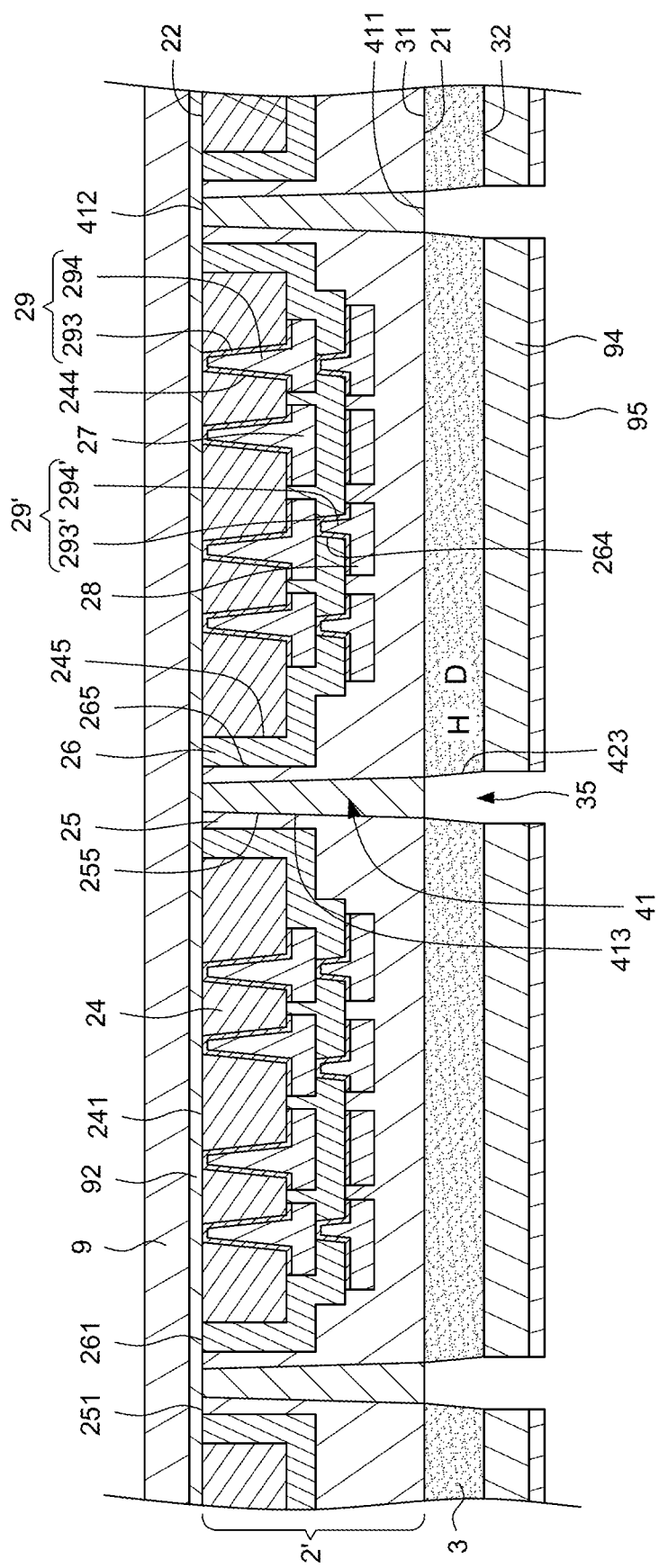
FIG. 23 illustrates one or more stages of an example of a method for manufacturing a wiring structure according to some embodiments of the present disclosure.

Referring to FIG. 23, the exposed portions of the adhesive layer 3 are removed to form a plurality of through holes 35 extending through the adhesive layer 3 to expose portions (e.g., the first end surfaces 411) of the first pillar portions 41 by etching technique or other suitable techniques.

Figure 24:
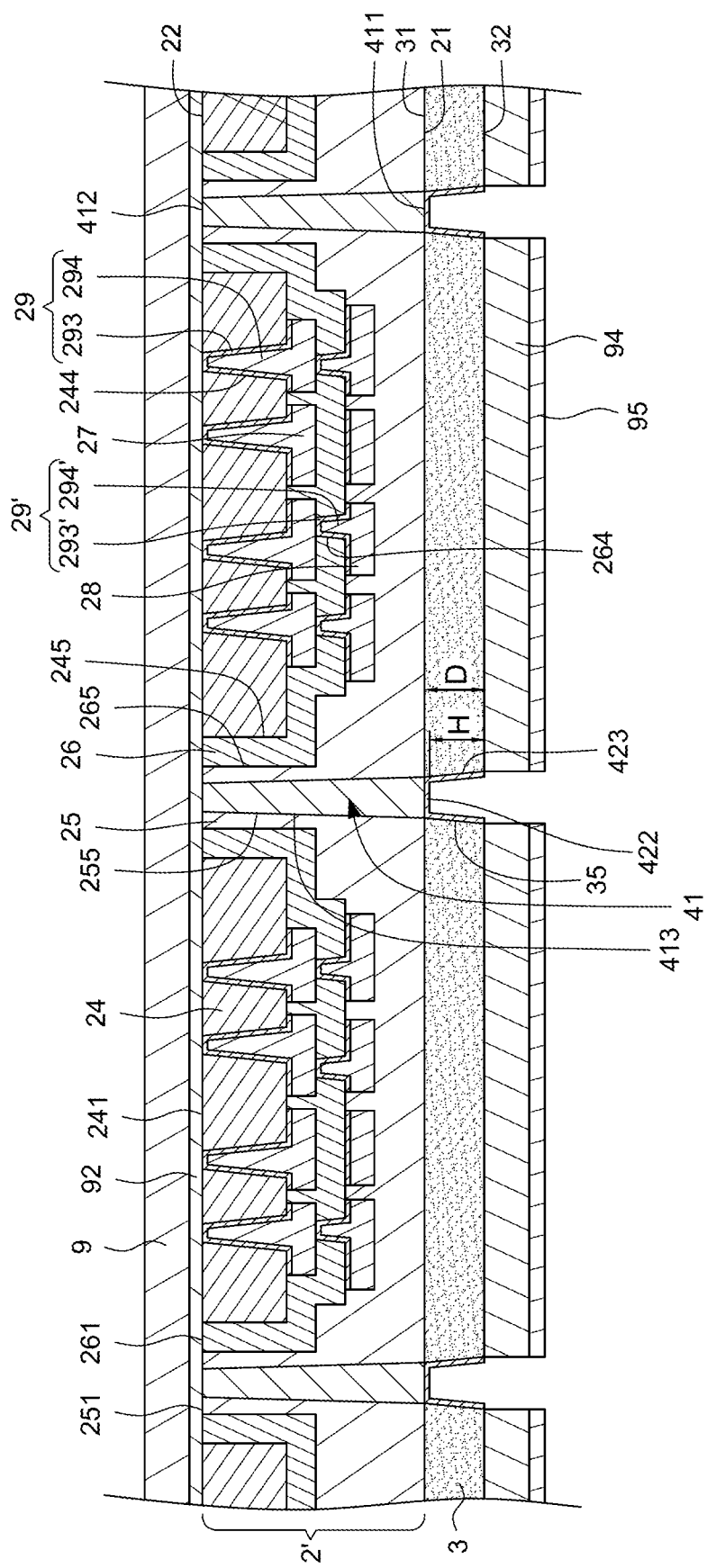
FIG. 24 illustrates one or more stages of an example of a method for manufacturing a wiring structure according to some embodiments of the present disclosure.
Figure 25:
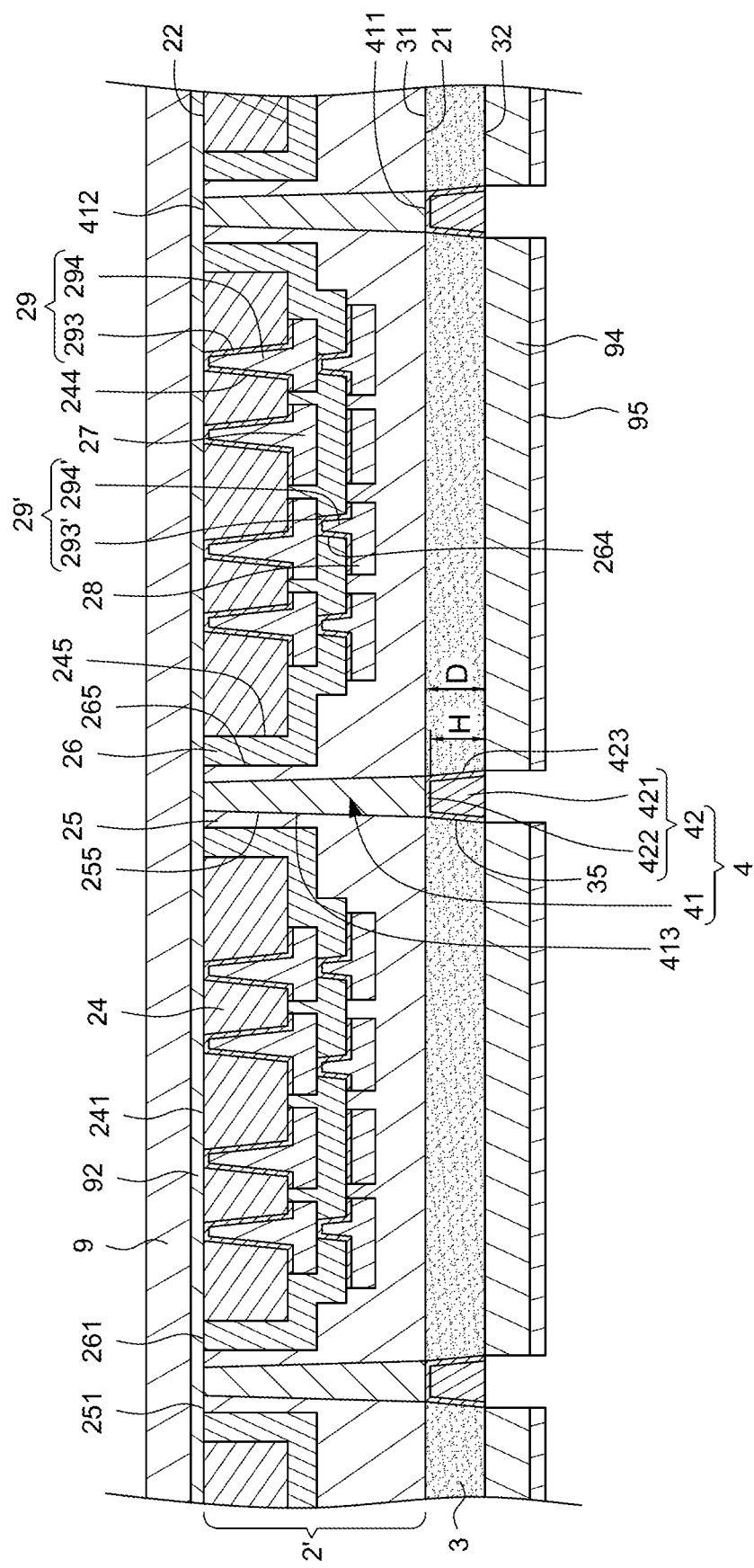
FIG. 25 illustrates one or more stages of an example of a method for manufacturing a wiring structure according to some embodiments of the present disclosure.

Referring to FIG. 24 through FIG. 25, a plurality of second pillar portions 42 are formed in the through holes 35 of the adhesive layer 3 and on the exposed portions (e.g., the first end surfaces 411) of the first pillar portions 41 to form a plurality of conductive pillars 4.

Referring to FIG. 24, a seed layer 422 is formed in the through holes 35 of the adhesive layer 3 and on the exposed portions (e.g., the first end surfaces 411) of the first pillar portions 41 by a physical vapor deposition (PVD) technique or other suitable techniques.

Referring to FIG. 25, a conductive material 421 (e.g., a metallic material) is formed in the through holes 35 of the adhesive layer 3 and on the seed layer 422 to form the second pillar portions 42 by a plating technique or other suitable techniques. Meanwhile, the conductive pillars 4 are formed.

Figure 26:
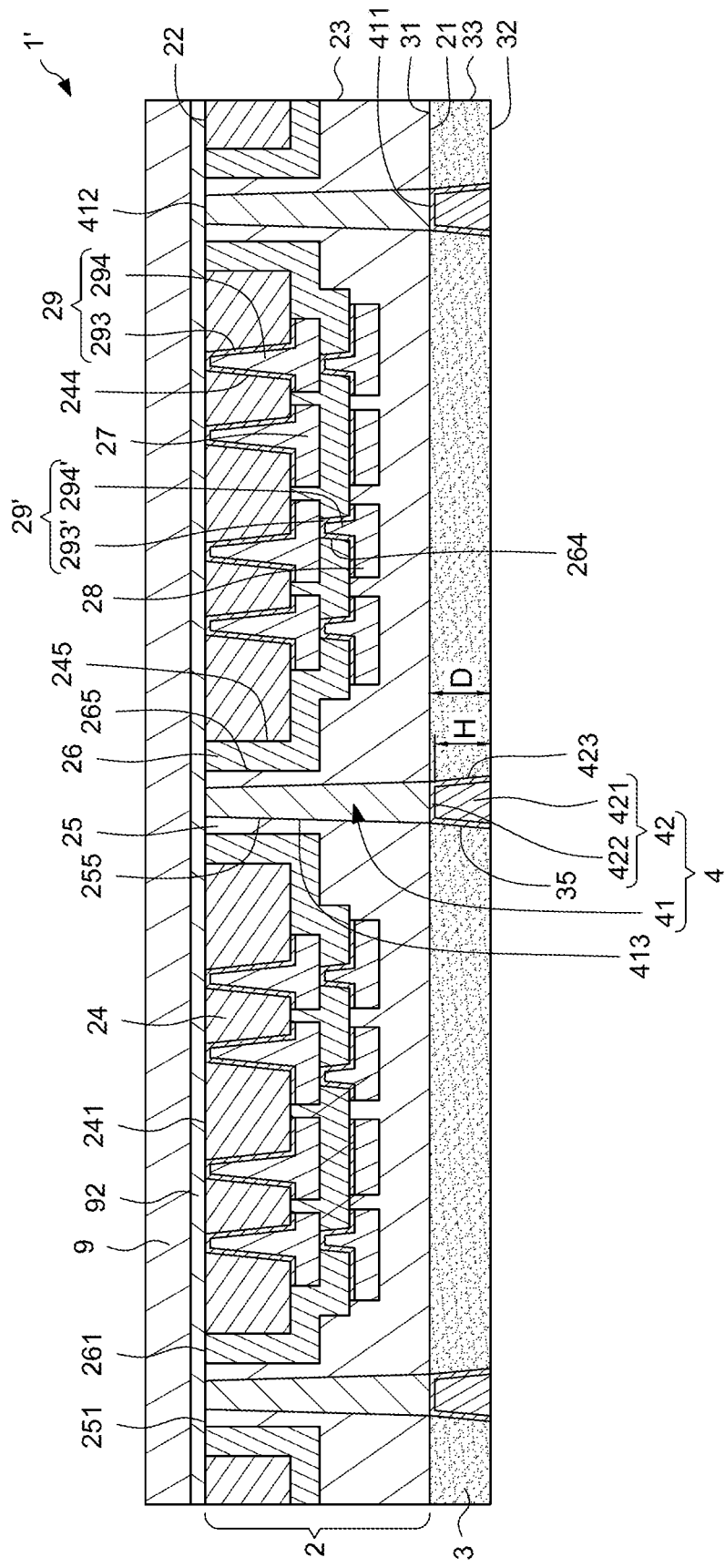
FIG. 26 illustrates one or more stages of an example of a method for manufacturing a wiring structure according to some embodiments of the present disclosure.

Referring to FIG. 26, the metal mask 94 and the photoresist layer 95 are removed, and then a singulation process is conducted to obtain a plurality of wiring structures P. In some embodiments, the carrier 9 and the seed layer 92 may be removed from the wiring structures 1' to obtain the wiring structure 1 of FIG. 1.

Figure 27:
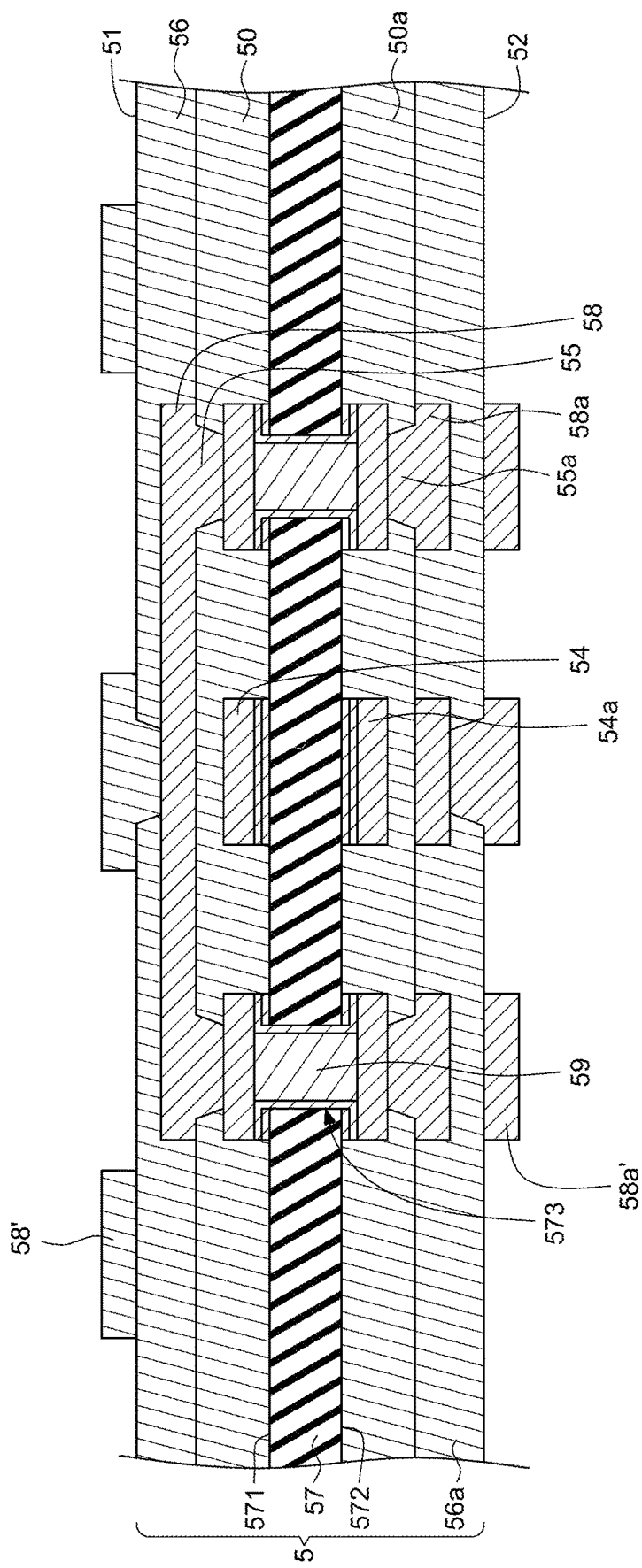
FIG. 27 illustrates one or more stages of an example of a method for manufacturing a wiring structure according to some embodiments of the present disclosure.
Figure 28:
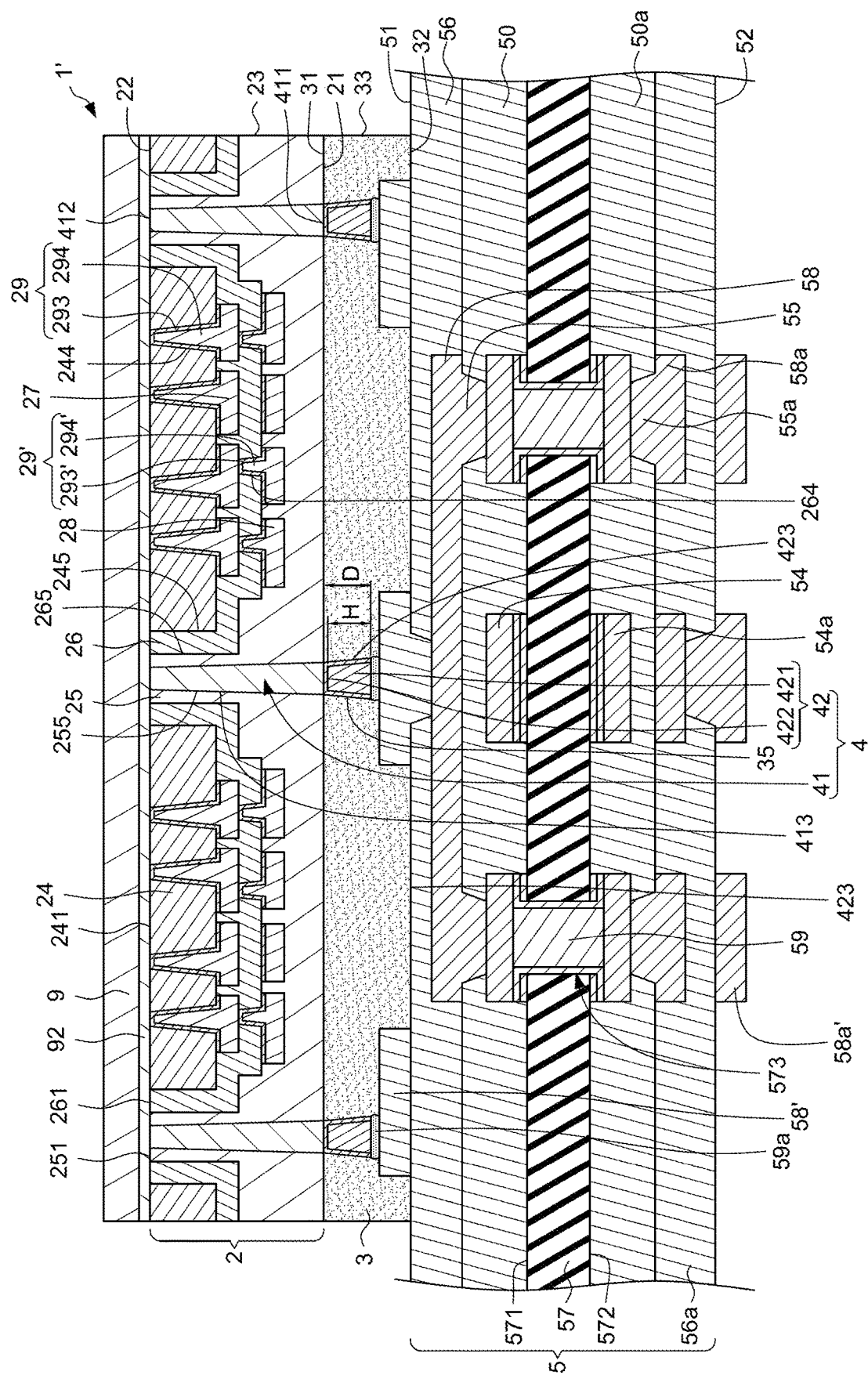
FIG. 28 illustrates one or more stages of an example of a method for manufacturing a wiring structure according to some embodiments of the present disclosure.
Figure 29:
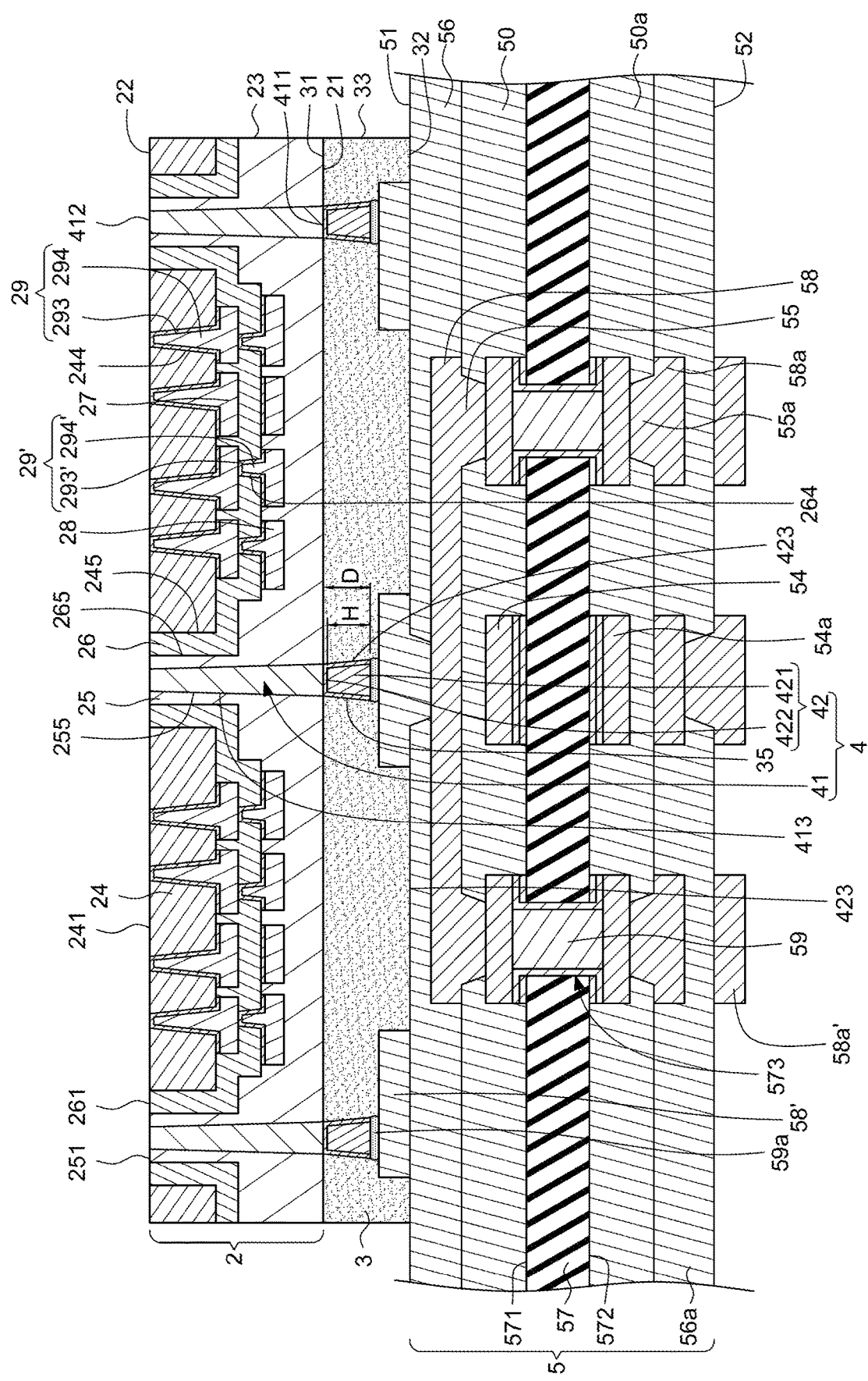
FIG. 29 illustrates one or more stages of an example of a method for manufacturing a wiring structure according to some embodiments of the present disclosure.

FIG. 27 through FIG. 29 illustrate a method for manufacturing a wiring structure according to some embodiments of the present disclosure. In some embodiments, the method is for manufacturing the wiring structure 1a shown in FIG. 7. The initial several stages of the illustrated process are the same as, or similar to, the stages illustrated in FIG. 10 through FIG. 26. FIG. 27 depicts a stage subsequent to that depicted in FIG. 26.

Referring to FIG. 27, a substrate structure 5 is provided. The substrate structure 5 of FIG. 27 may be the same as the substrate structure 5 of FIG. 7.

Referring to FIG. 28, the wiring structure 1' of FIG. 26 are disposed on and electrically connected to the substrate structure 5. As shown in FIG. 28, the adhesive layer 3 is disposed between the redistribution structure 2 and the substrate structure 5 and bonds the redistribution structure 2 and the substrate structure 5 together. In addition, the redistribution structure 2 may be electrically connected to the substrate structure 5 through the conductive pillars 4. In some embodiments, the conductive pillars 4 (e.g., the first pillar portions 41) may be bonded to the substrate structure 5 (e.g., the second upper circuit layer 58') through a bonding layer 59a.

Referring to FIG. 29, the carrier 9 and the seed layer 92 are removed.

Then, a singulation process may be conducted to the substrate structure 5 so as to obtain a plurality of wiring structures 1a shown in FIG. 7.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, a characteristic or quantity can be deemed to be "substantially" consistent if a maximum numerical value of the characteristic or quantity is within a range of variation of less than or equal to +10% of a minimum numerical value of the characteristic or quantity, such as less than or equal to +5%, less than or equal to +4%, less than or equal to +3%, less than or equal to +2%, less than or equal to +1%, less than or equal to +0.5%, less than or equal to +0.1%, or less than or equal to +0.05%.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be substantially flat if a displacement between a highest point and a lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A wiring structure, comprising:
    a substrate structure;
    a redistribution structure including at least one dielectric layer, wherein the at least one dielectric layer defines at least one through hole extending through the dielectric layer, the at least one dielectric layer includes a first dielectric layer and at least one second dielectric layer disposed adjacent to the first dielectric layer, the first dielectric layer defines at least one first opening extending through the first dielectric layer, and a portion of the second dielectric layer fills the first opening of the first dielectric layer;

an adhesive layer disposed between the redistribution structure and the substrate structure and bonding the redistribution structure and the substrate structure together; and at least one conductive pillar extending through the redistribution structure and the adhesive layer and electrically connected to the substrate structure, wherein a portion of the at least one conductive pillar is disposed in the through hole of the at least one dielectric layer, and the at least one conductive pillar extends through the filled portion of the second dielectric layer in the first opening.

2. The wiring structure of claim 1, wherein the at least one conductive pillar includes a first pillar portion extending through the redistribution structure and a second pillar portion extending through the adhesive layer and in contact with the first pillar portion.

3. The wiring structure of claim 2, wherein a height of the second pillar portion is less than a height of the first pillar portion.

4. The wiring structure of claim 2, wherein the first pillar portion has a first end surface contacting the second pillar portion and a second end surface opposite to the first end surface, and the first pillar portion tapers upward from the first end surface toward the second end surface.

5. The wiring structure of claim 4, wherein the redistribution structure includes a plurality of inner conductive vias, and the plurality of inner conductive vias taper upward.

6. The wiring structure of claim 5, wherein a thickness of one of the plurality of inner conductive vias adjacent to the substrate structure is less than a thickness of another one of the plurality of inner conductive vias away from the substrate structure.

7. The wiring structure of claim 2, wherein a peripheral surface of the second pillar portion and a peripheral surface of the first pillar portion are a discontinuous surface.

8. The wiring structure of claim 2, wherein the second pillar portion tapers upward from a bottom surface of the adhesive layer.

9. The wiring structure of claim 2, wherein the first pillar portion has a first end surface contacting the second pillar portion and a second end surface opposite to the first end surface, the redistribution structure has a first surface and a second surface opposite to the first surface, and the first end surface of the first pillar portion is non-coplanar with the first surface of the redistribution structure.

10. The wiring structure of claim 9, wherein the first end surface of the first pillar portion is recessed from the first surface of the redistribution structure.

11. The wiring structure of claim 1, wherein a width of the at least one conductive pillar is less than about 50 µm.

12. The wiring structure of claim 2, wherein a width of the second pillar portion is less than a width of the first pillar portion.

13. The wiring structure of claim 2, wherein the second pillar portion tapers towards the substrate structure.

14. The wiring structure of claim 1, wherein the at least one conductive pillar includes a first pillar portion extending through the filled portion of the second dielectric layer and a second pillar portion extending through the adhesive layer and in contact with the first pillar portion.

15. The wiring structure of claim 14, wherein the through hole extends through the filled portion of the second dielectric layer, and the first pillar portion is disposed in the through hole of the filled portion of the second dielectric layer.

16. The wiring structure of claim 15, wherein the through hole has an arc chamfer portion extending from one end of an inner wall of the through hole, and the first pillar portion covers the arc chamfer portion.

17. The wiring structure of claim 1, wherein a top surface of the second dielectric layer is substantially coplanar with a top surface of the first dielectric layer.

18. The wiring structure of claim 1, wherein the at least one conductive pillar extends through the second dielectric layer of the redistribution structure.

19. The wiring structure of claim 1, wherein a bonding surface is between the at least one conductive pillar and the substrate structure.

* * * * *